(12) United States Patent
Lim et al.

(10) Patent No.: US 7,684,233 B2
(45) Date of Patent: Mar. 23, 2010

(54) MULTI-BIT MAGNETIC MEMORY DEVICE USING SPIN-POLARIZED CURRENT AND METHODS OF MANUFACTURING AND OPERATING THE SAME

(75) Inventors: Chee-kheng Lim, Yongin-si (KR); Yong-su Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 348 days.

(21) Appl. No.: 11/347,228

(22) Filed: Feb. 6, 2006

(65) Prior Publication Data

US 2007/0206405 A1    Sep. 6, 2007

(30) Foreign Application Priority Data

Feb. 5, 2005    (KR) .................... 10-2005-0010985

(51) Int. Cl.
*G11C 11/00* (2006.01)
(52) U.S. Cl. ...................... 365/158; 365/173
(58) Field of Classification Search ............... 365/158, 365/171, 173
See application file for complete search history.

(56) References Cited

U.S. PATENT DOCUMENTS

| | | | |
|---|---|---|---|
| 6,172,904 B1 * | 1/2001 | Anthony et al. ............. | 365/173 |
| 6,775,183 B2 * | 8/2004 | Heide ........................ | 365/173 |
| 2004/0061154 A1 | 4/2004 | Huai et al. | |
| 2004/0076036 A1 * | 4/2004 | Heide ........................ | 365/173 |
| 2004/0165425 A1 | 8/2004 | Nakamura et al. | |
| 2004/0170055 A1 * | 9/2004 | Albert et al. ................ | 365/173 |
| 2004/0233761 A1 * | 11/2004 | Schwabe et al. ............ | 365/222 |
| 2005/0002131 A1 * | 1/2005 | Gill ........................ | 360/324.12 |
| 2005/0169047 A1 * | 8/2005 | Johnson ..................... | 365/158 |
| 2006/0138502 A1 * | 6/2006 | Sugahara et al. ............ | 257/295 |

FOREIGN PATENT DOCUMENTS

| | | |
|---|---|---|
| CN | 1503270 A | 6/2004 |
| EP | 1471543 A2 | 10/2004 |
| EP | 001689006 A2 * | 2/2006 |
| JP | 2004-158766 A | 6/2004 |
| JP | 2004158766 * | 6/2004 |
| JP | 2004-207707 A | 7/2004 |

* cited by examiner

*Primary Examiner*—Michael T Tran
(74) *Attorney, Agent, or Firm*—Sughrue Mion, PLLC

(57) ABSTRACT

A multi-bit magnetic memory device using a spin-polarized current and methods of manufacturing and operating the same. The magnetic memory device includes a switching device and a magnetic storage node connected to the switching device, wherein the magnetic storage node includes a first magnetic layer, a second magnetic layer and a free magnetic layer which are vertically and separately disposed from one another. The first and second magnetic layer have transmission characteristics opposite to each other for spin-polarized electrons, and have magnetic polarizations that are opposite to each other. The free magnetic layer may include first and second free magnetic layers, which are separately disposed from each other. The magnetic storage node may further include third and fourth magnetic layers that are separately disposed between the first and second free magnetic layers.

30 Claims, 19 Drawing Sheets

MULTI-BIT MAGNETIC MEMORY DEVICE USING SPIN-POLARIZED CURRENT AND METHODS OF MANUFACTURING AND OPERATING THE SAME

CROSS-REFERENCE TO RELATED PATENT APPLICATION

This application claims priority from Korean Patent Application No. 10-2005-0010985, filed on Feb. 5, 2005, in the Korean Intellectual Property Office, the disclosure of which is incorporated herein in its entirety by reference.

BACKGROUND OF THE INVENTION

1. Field of the Invention

Apparatuses and methods consistent with the present invention relate to a multi-bit magnetic memory device using a spin-polarized current, and methods of manufacturing and operating the same.

2. Description of the Related Art

One area of study in related art magnetic memory devices pertains to ways to decrease the operation current of the magnetic memory device, reduce the magnetic influence on other adjacent devices when accessing a selected device, and guarantee structural magnetic stability of the device. Accordingly, unlike early magnetic memory devices in which a magnetic field was used to record bit data, magnetic memory devices using spin-polarization characteristics of a current for recording bit data have been introduced.

FIGS. 1 through 4 illustrate related art magnetic memory devices using spin-polarization of electrons to record data. Since the related art magnetic memory devices use electron spin, they are advantageous in that they can precisely select cells compared to the early magnetic memory devices using a magnetic field, but disadvantageous in that magnetic coupling between a free magnetic layer and a lower magnetic layer is weak. In addition, the related art magnetic memory devices have material layers decreasing the density of spin-polarized electrons, thereby requiring more current for a normal operation. Therefore, the use of the above-described related art magnetic memory devices may be difficult.

SUMMARY OF THE INVENTION

The present invention provides a magnetic memory device that can minimize magnetic coupling between a free magnetic layer and a lower magnetic layer, reduce spin-polarized current density required for operation, and obtain magnetic stabilization.

The present invention also provides a method of operating the magnetic memory device.

The present invention further provides a method of manufacturing the magnetic memory device.

According to an aspect of the present invention, there is provided a magnetic memory device including a switching device and a magnetic storage node connected to the switching device, wherein the magnetic storage node includes a first magnetic layer, a second magnetic layer and a free magnetic layer which are vertically and separately disposed from one another, and the first and second magnetic layers may have transmission characteristics opposite to each other for spin-polarized electrons, and may have magnetic polarizations that are opposite to each other.

The free magnetic layer may comprise first and second free magnetic layers, which are separately formed from each other.

The magnetic storage node may further comprise third and fourth magnetic layers that are separately formed between the first and second free magnetic layers, the third and fourth magnetic layers may have transmission characteristics opposite to each other for spin-polarized electrons, and may have magnetic polarizations that are opposite to each other.

The second and third magnetic layers may be ferromagnetic layers that have the same transmission characteristics for spin-polarized electrons and have magnetic polarizations that are opposite to each other.

The second and third magnetic layers may be ferromagnetic layers that have transmission characteristics opposite to each other for spin-polarized electrons and have the same magnetic polarizations.

The first, second, third, and fourth magnetic layers may be respectively ferromagnetic layers having negative, positive, positive, and negative polarization characteristics for spin-polarized electrons, and the magnetic polarization thereof are respectively up, down, up, and down.

The first and second free magnetic layers may have different thicknesses from each other.

The magnetic storage node may further comprise a third magnetic layer that is disposed between the free magnetic layer and the second magnetic layer, transmits electrons with an opposite spin-polarization to the electron transmitted by the second magnetic layer, and has a magnetic polarization opposite to the magnetic polarization of the second magnetic layer. Wherein, the first, second, and third magnetic layers may be respectively ferromagnetic layers having positive, negative, and positive polarization characteristics, and the magnetic polarizations thereof may be up, down, and up, respectively.

The first, second, and third magnetic layers may be ferromagnetic layers having negative, positive, and negative polarization characteristics, and the magnetic polarizations thereof may be up, down, and up, respectively.

The first and second magnetic layers may be ferromagnetic layers having negative and positive polarization characteristics, and the magnetic polarizations thereof may be up and down, or down and up, respectively.

The first and second magnetic layers may be ferromagnetic layers having positive and negative polarization characteristics, and the magnetic polarizations thereof may be up and down, or down and up, respectively.

One of the first and second magnetic layers may be a layer selected from the group consisting of a NiFe layer, a Co layer, a CoFe layer, a Ni layer, an Fe layer, and a NiFeCu layer and the other may be a layer selected from the group consisting of an FeCr layer, a $CrO_2$/Co layer, an $Fe_3O_4$ layer, a $La_{0.7}Sr_{0.3}MnO_3$ layer, and an FeCr/Cr layer.

According to another aspect of the present invention, there is provided a method of operating a magnetic memory device including a switching device and a magnetic storage node connected to the switching device, wherein the magnetic storage node includes a first magnetic layer, a second magnetic layer and a free magnetic layer which are vertically and separately disposed from one another, and the first and second magnetic layers transmits electrons with opposite spins and have the magnetic polarizations that are opposite to each other, the method comprising: supplying a first current having spin up and spin down electrons to the magnetic storage node.

In this method, the first current may be supplied from the free magnetic layer to the first magnetic layer or in the opposite direction.

A third magnetic layer may be further disposed between the free magnetic layer and the second magnetic layer, the transmission characteristic and the magnetic polarization of the third magnetic layer for the electrons are opposite to those of the second magnetic layer.

The free magnetic layer may further comprise first and second free magnetic layers separated each other.

Third and fourth magnetic layers may be separately formed between the first and second magnetic layers, the third and fourth magnetic layers respectively have transmission characteristics opposite to each other for the electrons, and have the magnetic polarizations that are opposite to each other.

The second and third magnetic layers may be ferromagnetic layers that respectively have the same transmission characteristics for the electrons and have magnetic polarizations that are opposite to each other.

The second and third magnetic layers may be ferromagnetic layers that respectively have transmission characteristics opposite to each other for the electrons and have the same magnetic polarizations.

The first, second, third, and fourth magnetic layers may be respectively ferromagnetic layers having negative, positive, positive, and negative polarization characteristics for the electrons, and the magnetic polarization thereof are respectively up, down, up, and down.

The first and second free magnetic layers may have different thicknesses from each other.

The first, second, and third magnetic layers may be ferromagnetic layers having negative, positive, and negative polarization characteristics for the electrons, and the magnetic polarizations thereof are respectively up, down, and up.

The first, second, and third magnetic layers may be ferromagnetic layers having positive, negative, and positive polarization characteristics for the electrons, and the magnetic polarizations thereof are respectively up, down, and up.

A second current having a lower current density than the first current may be supplied in the opposite direction to the first current after the first current is supplied.

According to still another aspect of the present invention, there is provided a method of manufacturing a magnetic memory device, the method comprising: forming a switching device on a substrate; forming an interlayer insulation layer covering the switching device on the substrate; forming a seed layer on the interlayer insulation layer to connect to the switching device; sequentially stacking a first magnetic layer, a first non-magnetic layer, a second magnetic layer, a second non-magnetic layer, a free magnetic layer, and a capping layer on the seed layer; patterning the capping layer, the free magnetic layer, the second non-magnetic layer, the second magnetic layer, the first non-magnetic layer, and the first magnetic layer with a predetermined pattern; and forming a bit line connected to the capping layer, wherein the first and second magnetic layers are formed with ferromagnetic layers having transmission characteristics opposite to each other for spin-polarized electrons and having magnetic polarizations that are opposite to each other.

In this method, the stacking may further comprise sequentially forming a third magnetic layer and third non-magnetic layers between the second non-magnetic layer and the free magnetic layer, and the third magnetic layer is a ferromagnetic layer which has transmission characteristic opposite to that of the second magnetic layer for the spin-polarized electrons, and has a magnetic polarization opposite to that of the second magnetic layer.

The stacking may further comprise sequentially stacking a first free magnetic layer, a third non-magnetic layer, a third magnetic layer, a fourth non-magnetic layer, a fourth magnetic layer, a fifth non-magnetic layer, a second free magnetic layer, and the capping layer on the second non-magnetic layer.

One of the first and second magnetic layers may be a ferromagnetic layer having one of positive and negative polarization characteristics and having one of upward and downward magnetic polarization.

The second magnetic layer may be a ferromagnetic layer having one of positive and negative polarization characteristics and having one of upward and downward magnetic polarization.

The second and third magnetic layers may be ferromagnetic layers that respectively have the same transmission characteristics for the spin-polarized electrons and have magnetic polarizations that are opposite to each other.

The second and third magnetic layers may be ferromagnetic layers that have transmission characteristics opposite to each other for the spin-polarized electrons and have the same magnetic polarizations.

The first, second, third, and fourth magnetic layers may be respectively ferromagnetic layers having negative, positive, positive, and negative polarization characteristics, and the magnetic polarization thereof are respectively up, down, up, and down.

The first and second free magnetic layers may have different thicknesses from each other.

Throughout this disclosure, a layer having a positive polarization characteristic is defined as a magnetic layer through which more electrons having the same spin direction as the direction of the magnetic polarization of the magnetic layer pass than electrons having the opposite spin direction to the direction of the magnetic polarization of the magnetic layer when a current passes through the magnetic layer. On the other hand, a layer having a negative polarization characteristic is defined as a magnetic layer through which more electrons having the opposite spin direction to the direction of the magnetic polarization of the magnetic layer pass than electrons having the same spin direction to the direction of the magnetic polarization of the magnetic layer when a current passes through the magnetic layer.

The present invention can provide a device having a magnetically stable structure. In addition, such a structure allows the increase of a spin-polarized current density, thereby reducing a current density required for a switching operation and making a writing operation faster. When a magnetic storage node includes two free magnetic layers, multi-bit data can be recorded, and thus the integration of a device and a recording density can be increased.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
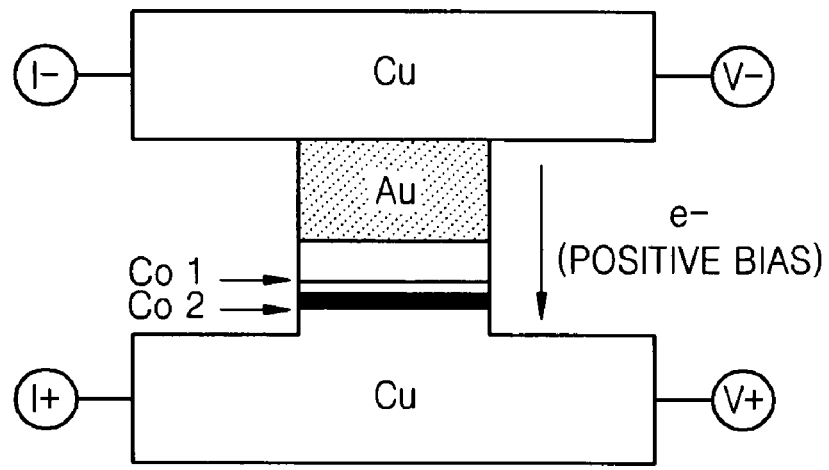
FIGS. 1 through 4 are cross-sectional views of magnetic tunneling junction (MTJ) cells of related art magnetic memory devices.
Figure 2:
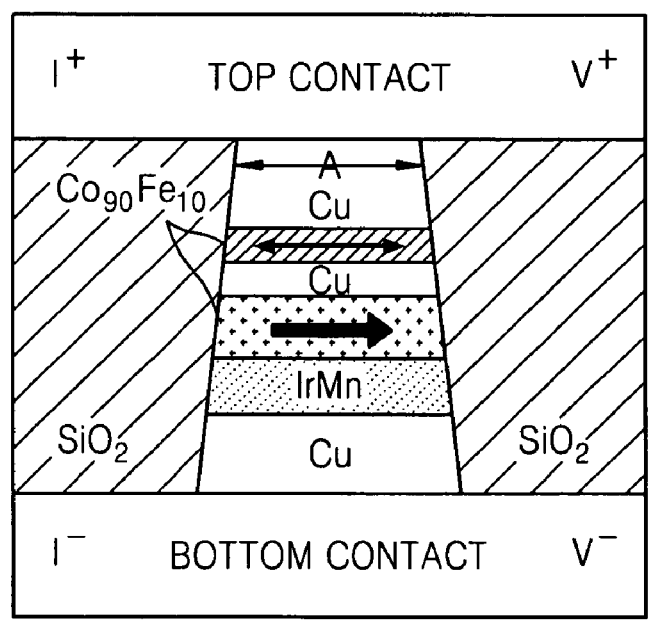
Figure 3:
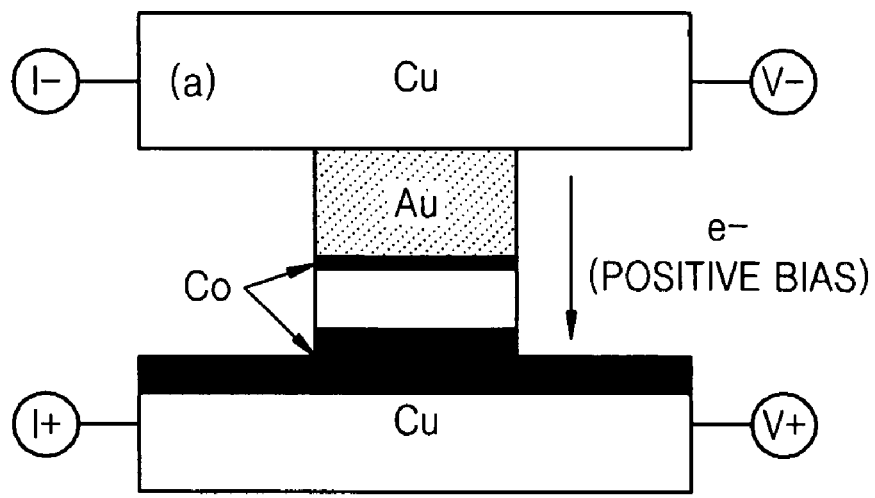
Figure 4:
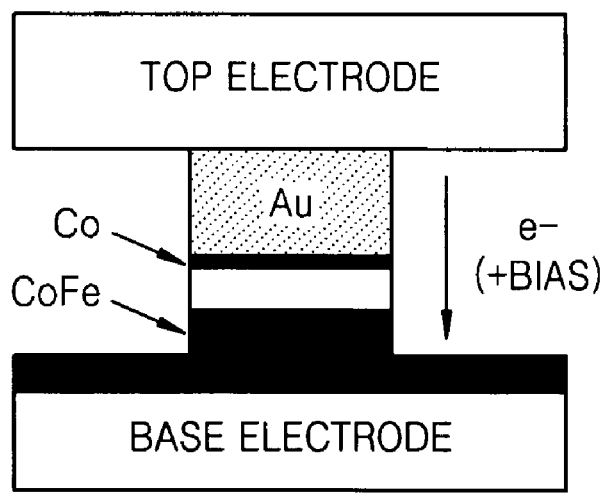

Hereinafter, the present invention will be described more fully with reference to the accompanying drawings, in which exemplary embodiments of the invention are shown. In the drawings, the sizes and thicknesses of layers and regions are exaggerated by scale for clarity.

Figure 5:
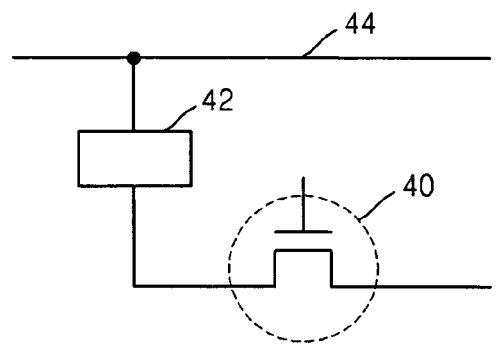
FIG. 5 is a schematically diagram of a magnetic memory device according to an exemplary embodiment of the present invention.

A multi-bit magnetic memory device according to an exemplary embodiment of the present invention will be described. FIG. 5 is a schematic diagram of a magnetic memory device according to an exemplary embodiment of the present invention. Referring to FIG. 5, the multi-bit magnetic memory device includes a transistor 40 and a magnetic storage node 42, for example, a magnetic tunneling junction (MTJ) cell, which is connected to the transistor 40. The transistor 40 may be a metal-oxide semiconductor field effect transistor (MOSFET). One end of the magnetic storage node 42 is connected to a bit line 44. Another switching device can be substituted for the transistor 40.

Figure 6:
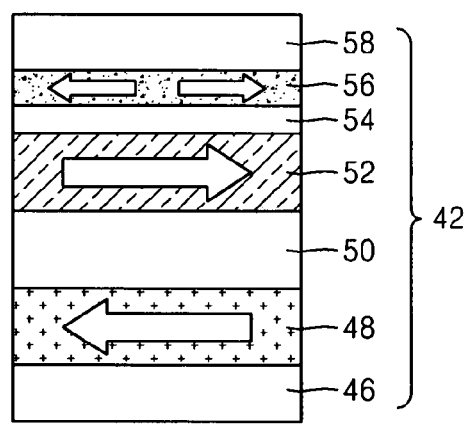
FIG. 6 is a cross-sectional view of a magnetic storage node of the magnetic memory device of FIG. 5, according to an exemplary embodiment of the present invention.
Figure 7:
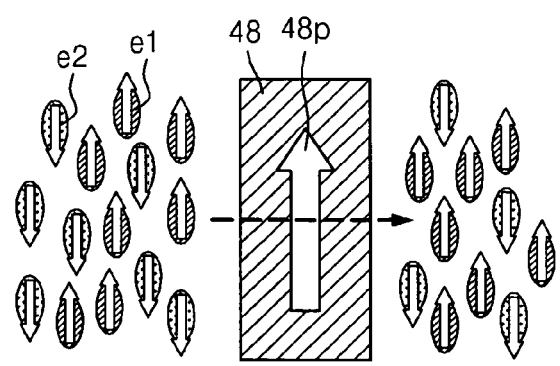
FIG. 7 is a cross-sectional view illustrating the transmission characteristics of spin-polarized electrons when a first magnetic layer of FIG. 6 is a ferromagnetic layer having positive polarization characteristic.
Figure 8:
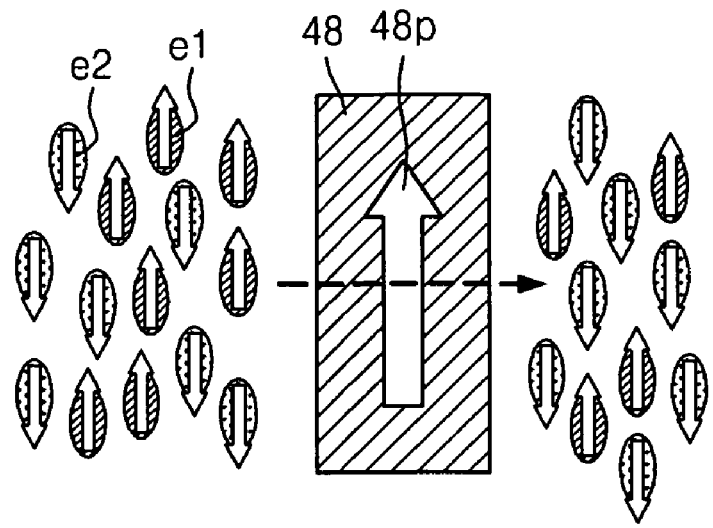
FIG. 8 is a cross-sectional view illustrating the transmission characteristics of spin-polarized electrons when the first magnetic layer of FIG. 6 is a ferromagnetic layer having negative polarization characteristic.

FIG. 6 is a cross-sectional view of a first structural example of the magnetic storage node 42 of FIG. 5, according to an exemplary embodiment of the present invention. Referring to FIG. 6, the magnetic storage node 42 includes a seed layer 46, a first magnetic layer 48, a first non-magnetic layer 50, a second magnetic layer 52, a second non-magnetic layer 54, a free magnetic layer 56, and a capping layer 58, which are sequentially stacked. The first and second magnetic layers 48 and 52, and the free magnetic layer 56 may be ferromagnetic layers. The first and second magnetic layers 48 and 52 may be ferromagnetic layers having different magnetic polarization characteristics. For example, the first magnetic layer 48 may be a ferromagnetic layer having a positive or negative polarization characteristic. As illustrated in FIG. 7, when the first magnetic layer 48 is a ferromagnetic layer having a positive polarization characteristic, among spin-up and spin-down electrons e1 and e2 flowing into the first magnetic layer 48, more of the spin-up electrons e1 having the same spin polarization direction as a magnetic polarization 40p of the first magnetic layer 48 pass through of first magnetic layer 48 than the spin-down electrons e2 having the opposite spin polarization direction to the magnetic polarization 48p of the first magnetic layer 48. On the other hand, as illustrated in FIG. 8, when the first magnetic layer 48 is a ferromagnetic layer having a negative polarization characteristic, among the spin-up and spin-down electrons e1 and e2 flowing into the first magnetic layer 48, more of the spin-down electrons e2 having the opposite spin polarization direction to the magnetic polarization 48p of the first magnetic layer 48 pass through the first magnetic layer 48 than the spin-up electrons e1 having the same spin polarization direction as the magnetic polarization 48p of the first magnetic layer 48, as illustrated in FIG. 8. Dotted arrows in FIGS. 7 and 8 indicate the flow direction of the electrons, opposite to the current direction.

Figure 9:
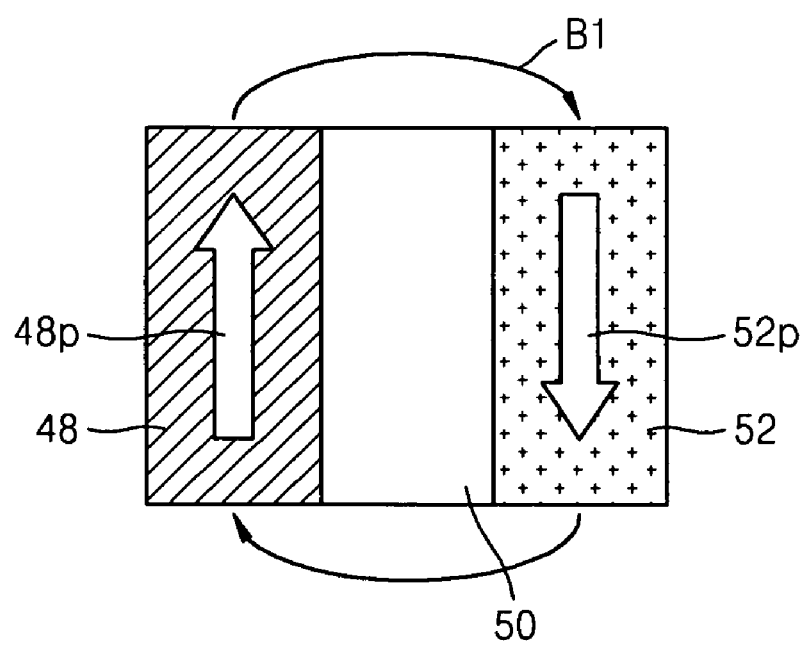
FIG. 9 is a schematic cross-sectional view illustrating a magnetic field distribution around the first and second magnetic layers when the first and second magnetic layers of FIG. 6 are ferromagnetic layers having opposite polarization characteristics for spin-polarized electrons.
Figure 10:
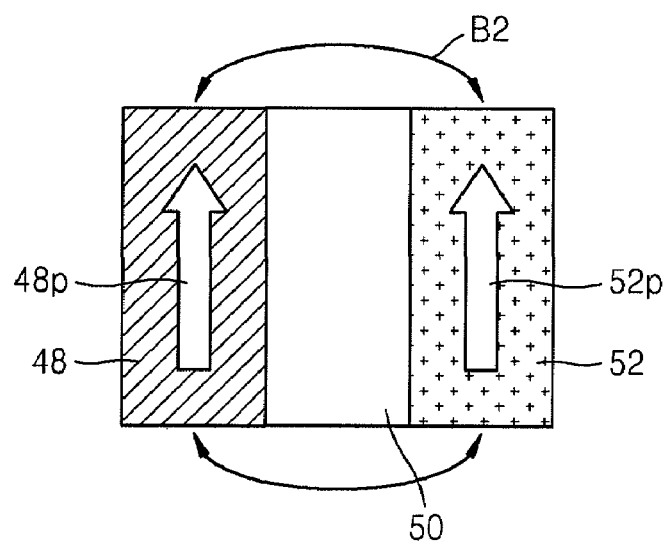
FIG. 10 a schematic cross-sectional view illustrating a magnetic field distribution around the first and second magnetic layers when the first and second magnetic layers of FIG. 6 are ferromagnetic layers having the same polarization characteristics for, spin-polarization electrons.

The second magnetic layer 52 may be a ferromagnetic layer having an opposite polarization characteristic to the first magnetic layer 48. Also, the magnetic polarization of the second magnetic layer 52 may be opposite to the magnetic polarization of the first magnetic layer 48. As illustrated in FIG. 9, When the first magnetic layer 48 is a ferromagnetic layer having a positive polarization characteristic and whose the magnetic polarization 48p is up, the second magnetic layer 52 may be a ferromagnetic layer which has a negative polarization characteristic whose a magnetic polarization 52p is down for magnetostatic stability. When the magnetic polarizations 48p and 52p are opposite to each other, a magnetic field B1 that is generated between the first and second magnetic layers 48 and 52 forms a closed flux loop. Accordingly, the first and second magnetic layers 48 and 52 magnetostatically become stable. However, when the first and second magnetic layers 48 and 52 are ferromagnetic layers having positive and negative polarization characteristics, respectively, and the magnetic polarization 48p and 52p thereof are the same each other, as illustrated in FIG. 10, a repulsive magnetic field B2 is formed between the first and second magnetic layers 48 and 52. Accordingly, the first and second magnetic layers 48 and 52 magnetically become unstable.

When the first and second magnetic layers 48 and 52 are ferromagnetic layers having positive polarization characteristics, the first and second magnetic layers 48 and 52 may be one of a NiFe layer, a Co layer, a CoFe layer, a Ni layer, an Fe layer, and a NiFeCu layer. When the first and second magnetic layers 48 and 52 are ferromagnetic layers having negative polarization characteristics, the first and second magnetic layers 48 and 52 may be one of an FeCr layer, a $CrO_2$/Co layer, an $Fe_3O_4$ layer, a $La_{0.7}Sr_{0.3}MnO_3$ layer, and an FeCr/Cr layer. The thicknesses of the first and second magnetic layers 48 and 52 may be different. The first and second magnetic layers 48 and 52 may be a single layer or include a plurality of magnetic layers. The plurality of magnetic layers may include a synthetic anti-ferromagnetic (SAF) layer.

Referring back to FIG. 6, the second non-magnetic layer 54 is a tunneling layer. The second non-magnetic layer 54 may be a conductive layer or an insulation layer, such as an aluminum oxide layer and manganese oxide. The seed layer 46 is a magnetic layer, a non-magnetic layer, or a combination of layers including a magnetic layer and a non-magnetic layer. The seed layer 46 may be, for example, a tantalum (Ta) layer or a ruthenium (Ru) layer or NiFeCr. The capping layer 58 protects the sequentially stacked material layers from external factors, for example, corrosion.

FIGS. 11 through 14 illustrate the operation of the memory device having the structure of FIG. 6 according to an exemplary embodiment of the present invention. The operation of the memory device is based on the reaction of the magnetic storage node 42 to a current flowing therethrough, as illustrated in FIGS. 11 through 14. In these drawings, it is assumed that the first and second magnetic layers 48 and 52 are respectively negative and positive polarization characteristics, and the magnetic polarizations thereof are respectively up and down. However, the spin polarization characteristics and the magnetic polarizations of the first and second magnetic layers 48 and 52 may be reversed. In FIGS. 11 through 14, the magnetic storage node 42 is disposed horizontally illustrated for convenience of explanation.

Figure 11:
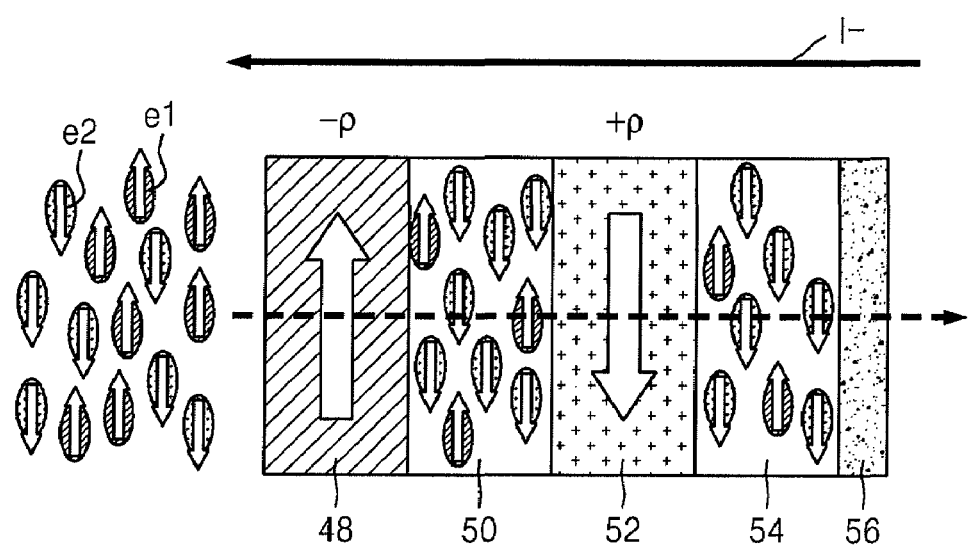
FIG. 11 is a cross-sectional view illustrating a flow of electrons when a current I⁻ flows from top to bottom of a free magnetic layer of the magnetic storage node of FIG. 6.

FIG. 11 shows the reaction of the free magnetic layer 56 when a current $I^-$ flows from the second non-magnetic layer 54 to the first magnetic layer 48, i.e., spin-up and spin-down electrons e1 and e2 move from the first magnetic layer 48 to the second non-magnetic layer 54. A reference symbol $-\rho$ indicates negative polarization characteristics and a reference symbol $+\rho$ indicates positive polarization characteristics.

Figure 12:
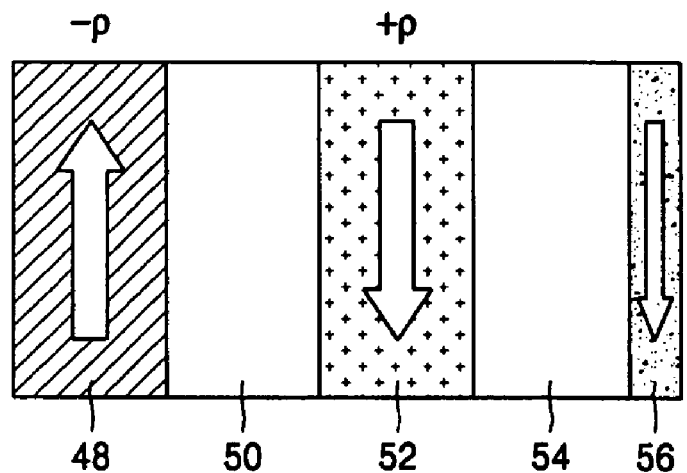
FIG. 12 is a cross-sectional view illustrating the magnetic polarization of the free magnetic layer by the current flow illustrated in FIG. 11.

Referring to FIG. 11, the number of spin-up electrons e1 is almost equal to the number of spin-down electrons e2 in the seed layer 46 (not illustrated in FIG. 11) before the spin-up and spin-down electrons e1 and e2 move into the first magnetic layer 48. However, when the spin-up and spin-down electrons e1 and e2 pass through the first magnetic layer 48 having negative polarization characteristics and an upward magnetic polarization, the spin-up electrons e1 pass at a lower rate than the spin-down electrons e2. Accordingly, the number of the spin-down electrons e2 passing the first magnetic layer 48 is greater than the number of the spin-up electrons e1. Then, when the electrons in the first non-magnetic layer 50 pass through the second magnetic layer 52 having a positive polarization characteristic and a downward magnetic polarization, most of the spin-down electrons e2 pass through the second magnetic layer 52, but only some of the spin-up electrons e1 pass the second magnetic layer 52. Accordingly, the number of the spin-down electrons e2 passing through the second magnetic layer 52 is much greater than the number of the spin-up electrons e1. Therefore, the spin-up and spin-down electrons e1 and e2 passing through the second magnetic layer 52 forms an overall a spin-down polarized current. The spin-down polarized current flows through the free magnetic layer 56, and then the magnetic polarization (indicated by a blank arrow therein) of the free magnetic layer 56 becomes parallel to the magnetic polarization of the second magnetic layer 52, as illustrated in FIG. 12.

Figure 13:
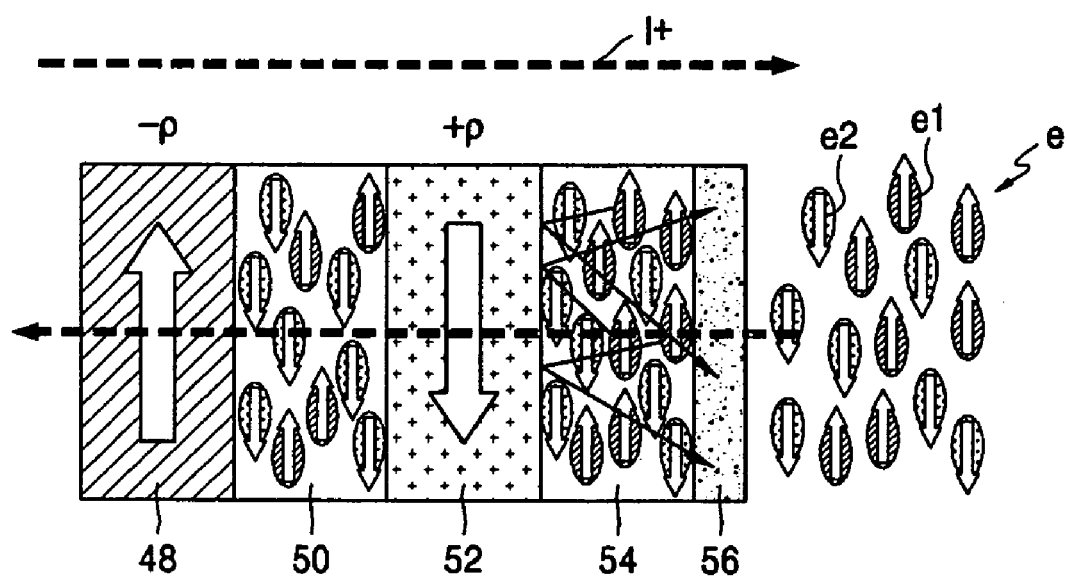
FIG. 13 is a cross-sectional view illustrating a flow of electrons when a current I⁺ flows from bottom to top of a free magnetic layer of the magnetic storage node of FIG. 6.

FIG. 13 shows the reaction of the free magnetic layer 56 when a current $I^+$ flows from the first magnetic layer 48 to the second non-magnetic layer 54, i.e., the spin-up and spin-down electrons e1 and e2 move from the second non-magnetic layer 54 to the first magnetic layer 48.

Figure 14:
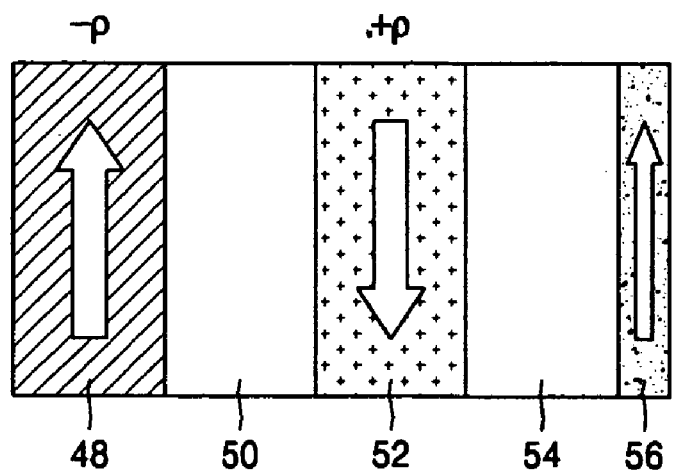
FIG. 14 is a cross-sectional view illustrating the magnetic polarization of the free magnetic layer by the current flows illustrated in FIG. 13.

Referring to FIG. 13, the number of the spin-up electrons e1 are almost equal to the number of the spin-down electrons e2 when the spin-up and spin-down electrons e1 and e2 pass through the capping layer 58 (not illustrated in FIG. 13), the free magnetic layer 56, and the second non-magnetic layer 54. However, when the electrons pass through the second magnetic layer 48 having positive polarization characteristic and a downward magnetic polarization, the spin-down electrons e2 having the same polarization as the second magnetic layer 52 can pass through the second magnetic layer 52, but most of the spin-up electrons e1 having opposite polarization to the second magnetic layer 52 cannot pass through the second magnetic layer 52 and are reflected to the free magnetic layer 56. Accordingly, the spin-up electrons e1 return through the free magnetic layer 56. The magnetic polarization of the free magnetic layer 56 becomes opposite to the magnetic polarization of the second magnetic layer 52, as illustrated in FIG. 14. It is assumed that bit data 0 is recorded in the magnetic storage node 42 when the magnetic polarization of the free magnetic layer 56 is as illustrated in FIG. 12, and that bit data 1 is recorded in the magnetic storage node 42 when the magnetic polarization of the free magnetic layer 56 is as illustrated in FIG. 14.

Figure 15:
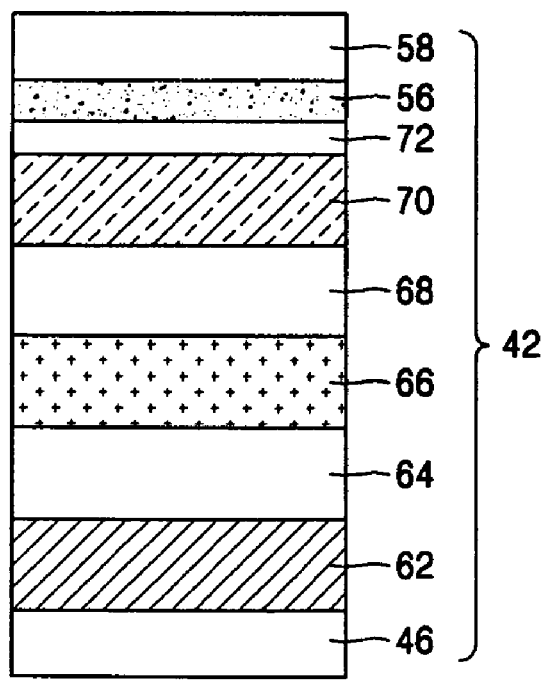
FIG. 15 is a cross-sectional view of another magnetic storage node of the magnetic memory device of FIG. 5, according to an exemplary embodiment of the present invention.
Figure 16:
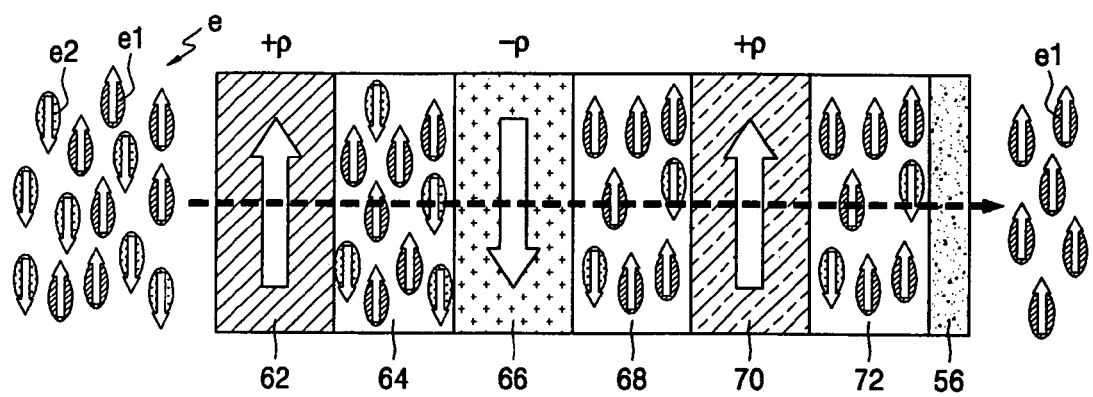
FIG. 16 is a cross-sectional view illustrating the flow of electrons when a current flows from top to bottom of the free magnetic layer of the magnetic storage node of FIG. 15, in the case where the first, second, and third magnetic layers of the magnetic storage node are ferromagnetic layers having positive, negative, and positive polarization characteristics, respectively, and the magnetic polarizations thereof are up, down, and up, respectively.
Figure 20:
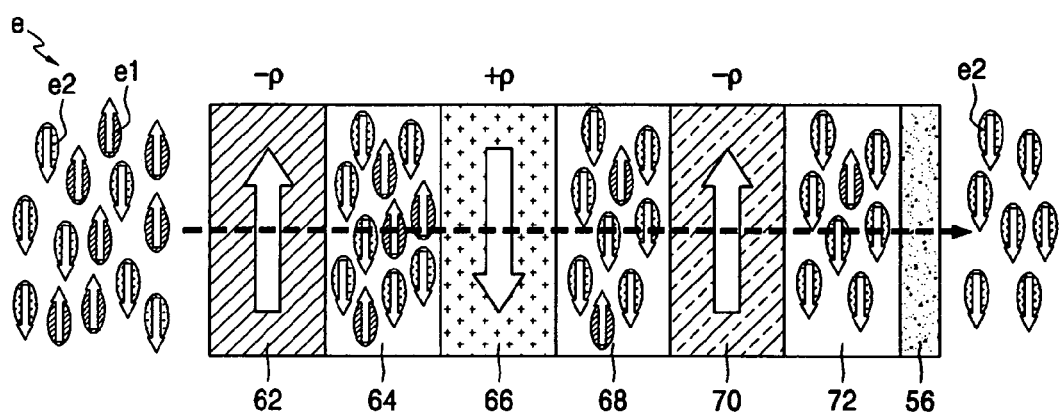
FIG. 20 is a cross-sectional view illustrating the flow of electrons when a current flows from top to bottom of the free magnetic layer of the magnetic storage node of FIG. 15, in the case where the first, second, and third magnetic layers of the magnetic storage node are ferromagnetic layers having negative, positive, and negative polarization characteristics, respectively, and the magnetic polarizations thereof are up, down, and up, respectively.

FIG. 15 is a cross-sectional view of the magnetic storage node 42 of FIG. 5, according to an exemplary embodiment of the present invention. Referring to FIG. 15, the magnetic storage node 42 includes a seed layer 46, a first magnetic layer 62, a first non-magnetic layer 64, a second magnetic layer 66, a second non-magnetic layer 68, a third magnetic layer 70, a third non-magnetic layer 72, a free magnetic layer 56, and a capping layer 58, which are sequentially stacked layers on the seed layer 46. The first, second, and third magnetic layers 62, 66 and 70 and the free magnetic layer 56 are formed of ferromagnetic materials. The first, second, and third magnetic layers 62, 66 and 70 may be positive or negative spin polarization layers, but adjacent magnetic layers among the first, second, and third magnetic layers 62, 66 and 70 should have different polarization characteristic, as illustrated in FIGS. 16 and 20. In FIG. 16, the first, second, and third magnetic layers 62, 66 and 70 are positive, negative, and positive polarization characteristics, respectively. In addition, the magnetic polarizations of the first, second, and third magnetic layers 62, 66 and 70 are up, down, and up, respectively. In FIG. 20, the first, second, and third magnetic layers 62, 66 and 70 are ferromagnetic layers having negative, positive, and negative polarization characteristics, respectively. In addition, the magnetic polarizations of the first, second, and third magnetic layers 62, 66 and 70 are up, down, and up, respectively.

In FIGS. 16 through 23, when the first, second, and third magnetic layers 62, 66, and 70 respectively have positive polarization characteristics, the first, second and third magnetic layers 62, 66, and 70 may be one of a NiFe layer, a Co layer, a CoFe layer, a Ni layer, an Fe layer, and a NiFeCu layer. When the first, second and third magnetic layers 62, 66, and 70 respectively have negative polarization characteristics, the first, second and third magnetic layers 62, 66, and 70 may be one of an FeCr layer, a $CrO_2$/Co layer, an $Fe_3O_4$ layer, a $La_{0.7}Sr_{0.3}MnO_3$ layer, and an FeCr/Cr layer. In FIGS. 16 through 23, the seed layer 46 and the capping layer 58 are not illustrated for convenience of explanation.

Figure 17:
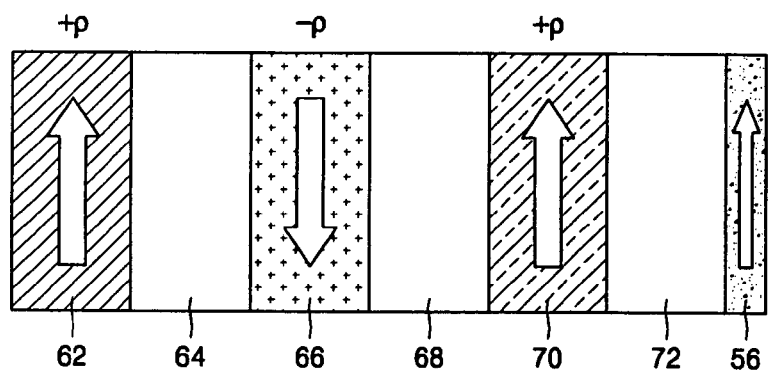
FIG. 17 is a cross-sectional view illustrating the magnetic polarization of the free magnetic layer by the current flow illustrated in FIG. 16.

Referring to FIG. 16, the first, second and third magnetic layers 62, 66, and 70 have positive, negative, and positive polarization characteristics, respectively. When electrons e initially including spin-up and spin-down electrons e1 and e2 at a 1:1 ratio move from the first magnetic layer 62 to the free magnetic layer 56, the ratio of the spin-up electrons e1 to the spin-down electrons e2 drastically increases after the electrons sequentially pass through the first, second and third magnetic layers 62, 66, and 70. Accordingly, a current $I^-$ passing through the free magnetic layer 56 becomes a spin-up polarized current. In response to such a current, the magnetic polarization of the free magnetic layer 56 becomes the same as the magnetic polarization of the third magnetic layer 70, as illustrated in FIG. 17.

Figure 18:
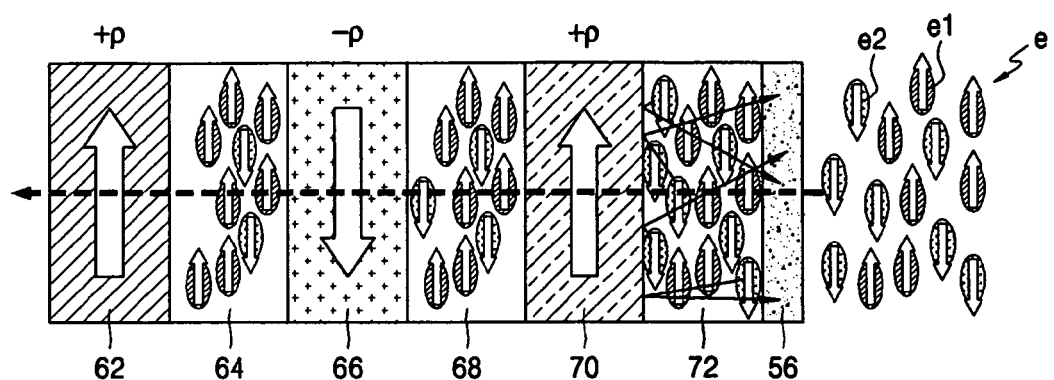
FIG. 18 is a cross-sectional view illustrating the flow of electrons when a current flows from bottom to top of the free magnetic layer of the magnetic storage node of FIG. 15, in the case where the first, second, and third magnetic layers of the magnetic storage node are ferromagnetic layers having positive, negative, and positive polarization characteristics, respectively, and the magnetic polarizations thereof are up, down, and up, respectively.
Figure 19:
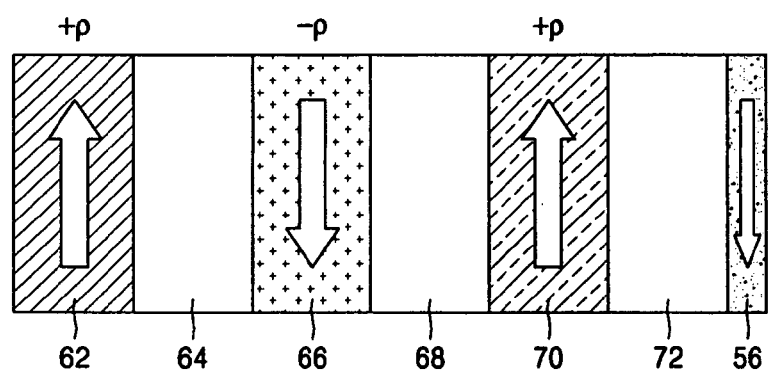
FIG. 19 is a cross-sectional view illustrating the magnetic polarization of the free magnetic layer by the current flow illustrated in FIG. 18.

When the spin polarization characteristics and the magnetic polarization characteristics of the first, second, and third magnetic layers 62, 66, and 70 are the same as those in FIG. 16 and the current direction is opposite to that in FIG. 16, electrons e initially including spin-up and spin-down electrons e1 and e2 at a 1:1 ratio move from the free magnetic layer 56 to the first magnetic layer 62, as illustrated in FIG. 18. Here, since the third magnetic layer 70 is a ferromagnetic layer having a positive polarization characteristic and has upward magnetic polarization, a large number of the spin-down electrons e2 are reflected to the free magnetic layer 56 when the electrons e reach the third magnetic layer 70 after passing through the free magnetic layer 56. The spin-down electrons e2 reflected from the third magnetic layer 70 pass through the free magnetic layer 56. Accordingly, the magnetic polarization of the free magnetic layer 56 becomes the same as the spin-polarization of the spin-down electrons e2. Therefore, the magnetic polarization of the free magnetic layer 56 is opposite to the magnetic polarization of the third magnetic layer 70, as illustrated in FIG. 19. When the magnetic polarizations of the third magnetic layer 70 and the free magnetic layer 56 have the same polarization as illustrated in FIG. 17, it is assumed that bit data 0 is recorded in the magnetic storage node 42 of FIG. 15. When the magnetic polarizations of the third magnetic layer 70 and the free magnetic layer 56 are opposite to each other as illustrated in FIG. 19, it is assumed that bit data 1 is recorded in the magnetic storage node 42 of FIG. 15. Alternatively, when the magnetic polarizations of the third magnetic layer 70 and the free magnetic layer 56 are the same as illustrated in FIG. 17, it can be assumed that bit data 1 is recorded in the magnetic storage node 42 of FIG. 15, and when the magnetic polarizations of the third magnetic layer 70 and the free magnetic layer 56 are opposite to each other as illustrated in FIG. 19, it can be assumed that bit data 0 is recorded in the magnetic storage node 42 of FIG. 15.

Meanwhile, the result illustrated in FIG. 19 can be obtained by substituting the first, second, and third magnetic layers 62, 66, and 70 in FIG. 16 with ferromagnetic layers having opposite magnetic polarizations. Also, the result illustrated in FIG. 17 can be obtained by substituting the first, second, and third magnetic layers 62, 66, and 70 in FIG. 18 with ferromagnetic layers having opposite magnetic polarizations.

Figure 21:
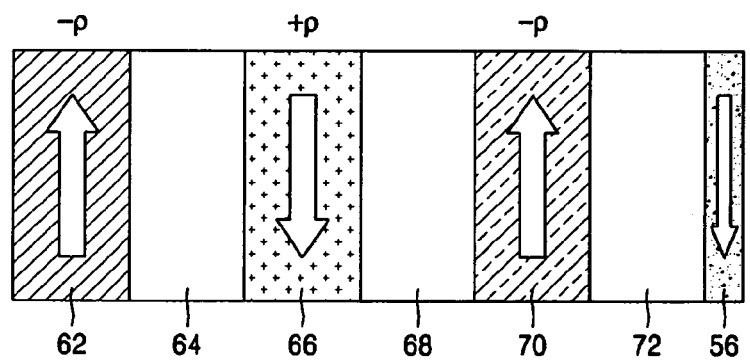
FIG. 21 is a cross-sectional view illustrating the magnetic polarization of the free magnetic layer by the current flow illustrated in FIG. 20.

As illustrated in FIG. 20, when the first, second, and third magnetic layers 62, 66, and 70 are respectively ferromagnetic layers having negative, positive, and negative polarization characteristics, and the magnetic polarization thereof are respectively up, down, and up, the electrons e initially including the spin-up and spin-down electrons e1 and e2 at a 1:1 ratio move from the first magnetic layer 62 to the free magnetic layer 56, the concentration of the spin-up electrons e1 in the electrons e drastically decreases after the electrons e pass through the third magnetic layer 70 due to the polarization characteristic of the first, second, and third magnetic layers 62, 66, and 70. Accordingly, current having a much higher concentration of the spin-down electrons e2, i.e., a spin-down polarized current, flows through the free magnetic layer 56. Therefore, the magnetic polarization of the free magnetic layer 56 becomes opposite to the magnetic polarization of the third magnetic layer 70, as shown in FIG. 21. When the polarization characteristics of the first, second, and third magnetic layers 62, 66, and 70 of FIG. 20 are unchanged but the magnetic polarizations thereof are reversed, that is, down, up, and down, the magnetic polarization of the free magnetic layer 56 becomes the same as the magnetic polarization of the third magnetic layer 70.

Figure 22:
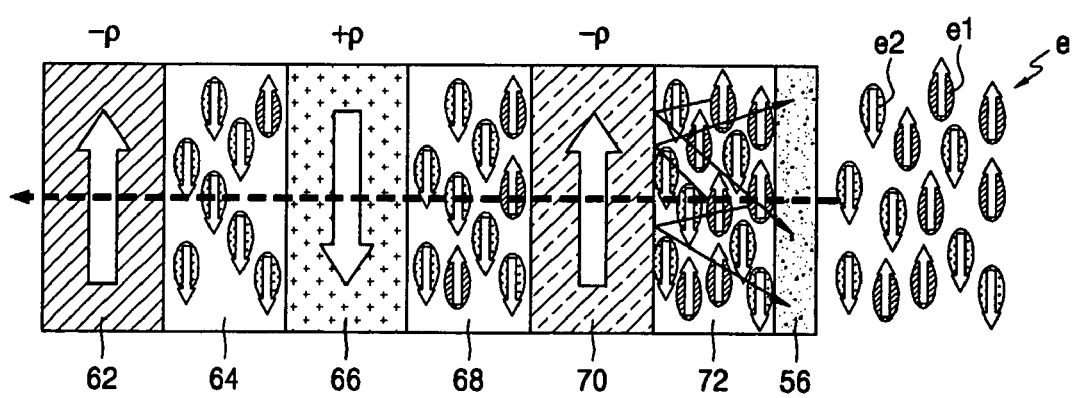
FIG. 22 is a cross-sectional view illustrating the flow of electrons when a current flows from bottom to top of the free magnetic layer of the magnetic storage node of FIG. 15, in the case where the first, second, and third magnetic layers of the magnetic storage node are ferromagnetic layers having negative, positive, and negative polarization characteristics, respectively, and the magnetic polarizations thereof are up, down, and up, respectively.
Figure 23:
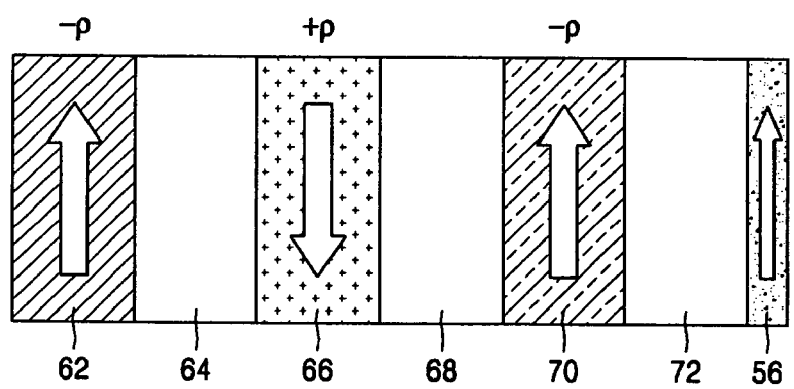
FIG. 23 is a cross-sectional view illustrating the magnetic polarization of the free magnetic layer by the current flow illustrated in FIG. 22.

The case where the electrons e move in the opposite direction to that illustrated in FIG. 20 will now be described. Referring to FIG. 22, a large number of spin-up electrons e1 are reflected from the third magnetic layer 70 to the free magnetic layer 56. Due to the reflected spin-up electrons e1, the magnetic polarization of the free magnetic layer 56 becomes the same as the magnetic polarization of the third magnetic layer 70, as illustrated in FIG. 23. If the spin polarization characteristics of the first, second, and third magnetic layers 62, 66, and 70 of FIG. 22 are unchanged but the magnetic polarizations thereof become are reversed, that is, down, up, and down, the magnetic polarization of the free magnetic layer 56 becomes opposite to the magnetic polarization of the third magnetic layer 70.

Figure 24:
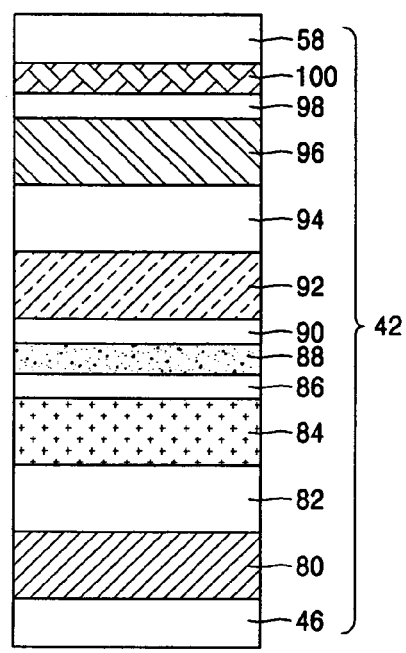
FIG. 24 is a cross-sectional view of another magnetic storage node of the magnetic memory device of FIG. 5, according to an exemplary embodiment of the present invention.

FIG. 24 is a cross-sectional view of the magnetic storage node 42 of FIG. 5, according to an exemplary embodiment of the present invention. Referring to FIG. 24, the magnetic storage node 42 includes a seed layer 46, a first magnetic layer 80, a first non-magnetic layer 82, a second magnetic layer 84, a second non-magnetic layer 86, a first free magnetic layer 88, a third non-magnetic layer 90, a third magnetic layer 92, a fourth non-magnetic layer 94, a fourth magnetic layer 96, a fifth non-magnetic layer 98, a second free magnetic layer 100, and a capping layer 58, which are sequentially stacked layers a seed layer 46. The first magnetic layer 80, the first non-magnetic layer 82, the second magnetic layer 84, the second non-magnetic layer 86, and the first free magnetic layer 88 may form a lower magnetic tunneling junction (MTJ) cell, and the third non-magnetic layer 90, the third magnetic layer 92, the fourth non-magnetic layer 94, the fourth magnetic layer 96, the fifth non-magnetic layer 98, and the second free magnetic layer 100 may form an upper magnetic tunneling junction (MTJ) cells. When the first, second, third, and fourth magnetic layers 80, 84, 92, and 96 are respectively positive polarization characteristics, the first, second, third, and fourth magnetic layers 80, 84, 92, and 96 may be one of a NiFe layer, a Co layer, a CoFe layer, a Ni layer, an Fe layer, and a NiFeCu layer. If the first, second, third, and fourth magnetic layers 80, 84, 92, and 96 are respectively negative polarization characteristics, the first, second, third, and fourth magnetic layers 80, 84, 92, and 96 may be one of an FeCr layer, a $CrO_2/Co$ layer, an $Fe_3O_4$ layer, a $La_{0.7} Sr_{0.3} MnO_3$ layer, and an FeCr/Cr layer.

The magnetic polarization of the first and second free magnetic layers 88 and 100 in FIG. 24 may or may not be the same according to the direction or amount of current supplied to the layers, and the current required for operating may be varied according to the thicknesses of the first and second free magnetic layers 88 and 100, as will be described with reference to FIGS. 25 through 32. The seed layer 46 and the capping layer 58 are not illustrated in FIGS. 25 through 32 for convenience of explanation. In FIGS. 25 through 32, the first, second, third, and fourth magnetic layers 80, 84, 92, and 96 are respectively ferromagnetic layers having negative, positive, positive, and negative polarization characteristics and the magnetic polarizations thereof are respectively up, down, up, and down. Such properties of the first, second, third, and fourth magnetic layers 80, 84, 92, and 96 can be changed.

Figure 25:
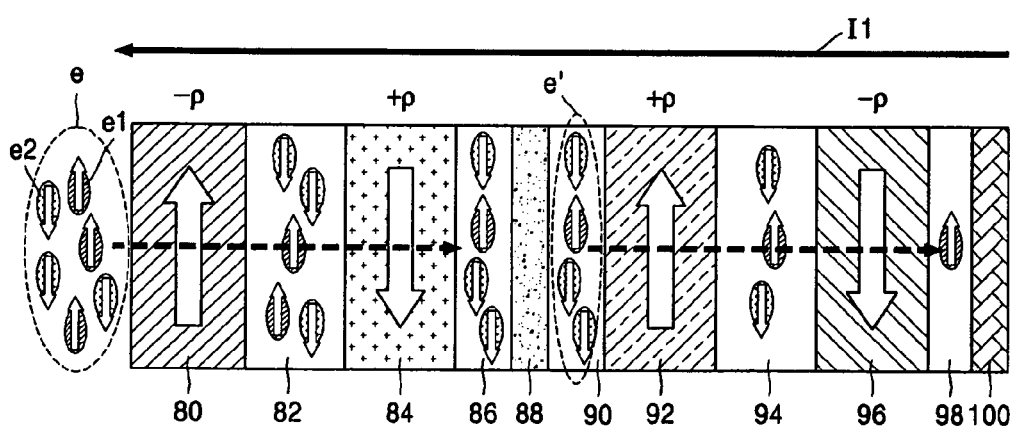
FIG. 25 is a cross-sectional view illustrating a flow of electrons when a current flows from top to bottom of the free magnetic layer of the magnetic storage node of FIG. 24, in the case where the first, second, third, and fourth magnetic layers of the magnetic storage node are ferromagnetic layers having negative, positive, positive, and negative polarization characteristics, respectively, and the magnetic polarizations thereof are up, down, up, and down, respectively.
Figure 26:
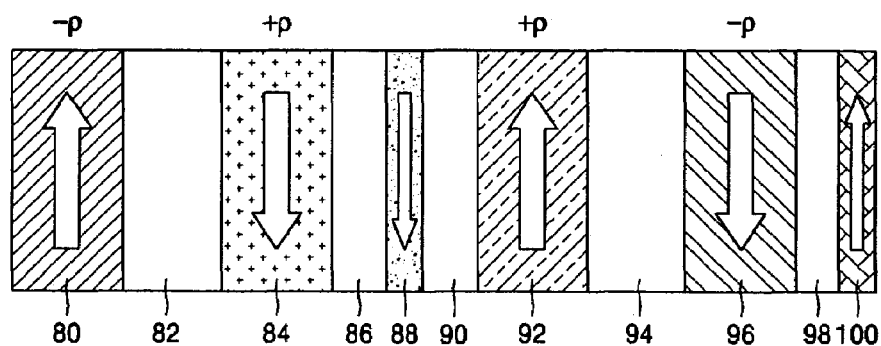
FIG. 26 is a cross-sectional view illustrating the magnetic polarizations of the free magnetic layers by the current flow illustrated in FIG. 25.

FIGS. 25 and 26 illustrate magnetic polarization characteristics of the first and second free magnetic layers 88 and 100 when a first current I1 flows from the second free magnetic layer 100 through the first free magnetic layer 88 to the first magnetic layer 80, i.e., the electrons e move from the first magnetic layer 80 through the first free magnetic layer 88 to the second free magnetic layer 100.

Referring to FIG. 25, as the electrons e initially including the spin-up and spin-down electrons e1 and e2 at a 1:1 ratio pass through the first magnetic layer 80 having negative polarization characteristic and the second magnetic layer 84 having positive polarization characteristic, the concentration of the spin-down electrons e2 in the electrons e increases. Accordingly, a current passing through the free magnetic layer 88 becomes a spin-down polarized current. Because of the spin-polarized current, the direction of the magnetic polarization of the first free magnetic layer 88 becomes the same as the direction of the spin-polarization of the spin-polarized current, and thus the magnetic polarization of the second magnetic layer 84 becomes the same as the magnetic polarization of the first free magnetic layer 88, as illustrated in FIG. 26.

The spin-polarized current that has passed through the first free magnetic layer 88, in other words, electrons e' having a high ratio of the spin-down electrons e2 to the spin-up electrons e1 pass through the third magnetic layer 92 having positive polarization characteristic, and the concentration of the spin-down electrons e2 in the electrons e' decreases. Next, the electrons e' pass the fourth magnetic layer 96 having negative polarization characteristic and a downward magnetic polarization, and thus mainly the spin-up electrons e1 enter the second free magnetic layer 100. Accordingly, the direction of the magnetic polarization of the second free magnetic layer 100 becomes the same as the direction of spin-polarization of the spin-up electrons e1. Therefore, the magnetic polarization of the second free magnetic layer 100 becomes opposite to the magnetic polarization of the fourth magnetic layer 96 and the magnetic polarization of the first free magnetic layer 88, as illustrated in FIG. 26. Although the second free magnetic layer 100 and the first free magnetic layer 88 have the same thicknesses in FIG. 25, the thicknesses of the second free magnetic layer 100 and the first free magnetic layer 88 may be different.

Figure 27:
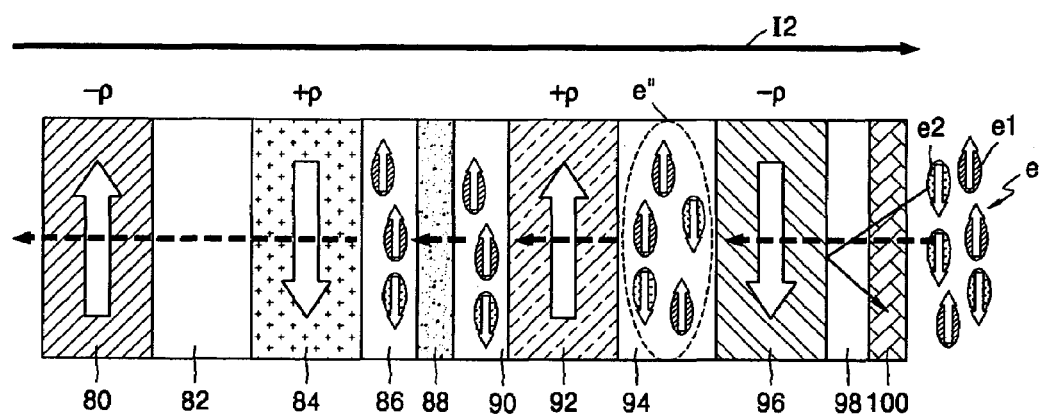
FIG. 27 is a cross-sectional view illustrating a flow of electrons when a current flows from bottom to top of the free magnetic layer of the magnetic storage node of FIG. 24, in the case where the first, second, third, and fourth magnetic layers of the magnetic storage node are ferromagnetic layers having negative, positive, positive, and negative polarization characteristics, respectively, and the magnetic polarizations thereof are up, down, up, and down, respectively.
Figure 28:
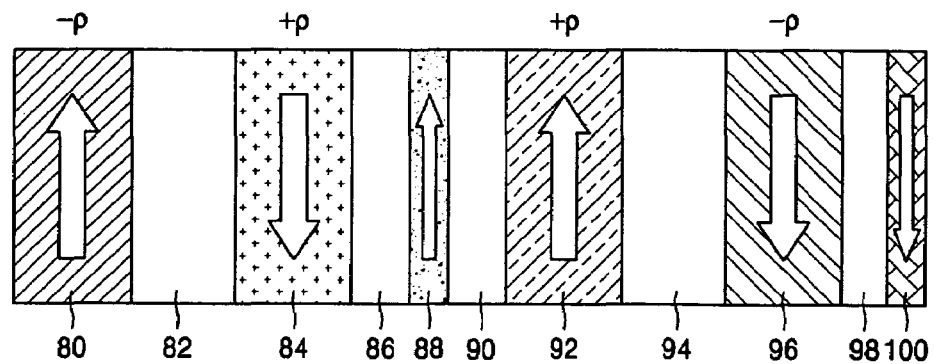
FIG. 28 is a cross-sectional view illustrating the magnetic polarizations of the free magnetic layers by the current flow illustrated in FIG. 27.

FIGS. 27 and 28 illustrate magnetic polarization characteristics of the first and second free magnetic layers 88 and 100 when a second current 12 is supplied to move the electrons e from the second magnetic layer 100 to the first free magnetic layer 88.

Referring to FIG. 27, when the electrons e pass through the fourth magnetic layer 96 having negative polarization characteristic and downward magnetic polarization after passing through the second free magnetic layer 100, some of the spin-down electrons e2 of which the direction of spin-polarization is the same as the direction of magnetic polarization of the fourth magnetic layer 96 cannot pass through the fourth magnetic layer 96, and are reflected at the boundary between the fourth magnetic layer 96 and the fifth non-magnetic layer 98 to the second free magnetic layer 100. As the reflected spin-down electrons e2 pass the second free magnetic layer 100, the direction of the magnetic polarization of the second free magnetic layer 100 becomes the same as the direction of the spin-polarization of the spin-down electrons e2. Consequently, the magnetic polarization of the second free magnetic layer 100 becomes the same as the magnetic polarization of the fourth magnetic layer 96, as illustrated in FIG. 28. Since some spin-down electrons e2 are reflected when they pass through the fourth magnetic layer 96, the concentration of the spin-up electrons e1 in electrons e" is higher than the concentration of the spin-down electrons e2 after passing through the fourth magnetic layer 96. The concentration of the spin-up electrons e1 in the electrons e" increases after passing through the third magnetic layer 92 having positive polarization characteristic and an upward magnetic polarization. Accordingly, a spin-up polarized current is supplied to the first free magnetic layer 88. As the spin-up polarized current passes through the first free magnetic layer 88, the direction of the magnetic polarization of the first free magnetic layer 88 becomes the same as the direction of the spin-polarization of the spin-up polarized current. Consequently, the magnetic polarization of the first free magnetic layer 88 becomes opposite to the magnetic polarizations of the second magnetic layer 84 and the second free magnetic layer 100, as illustrated in FIG. 28.

Figure 29:
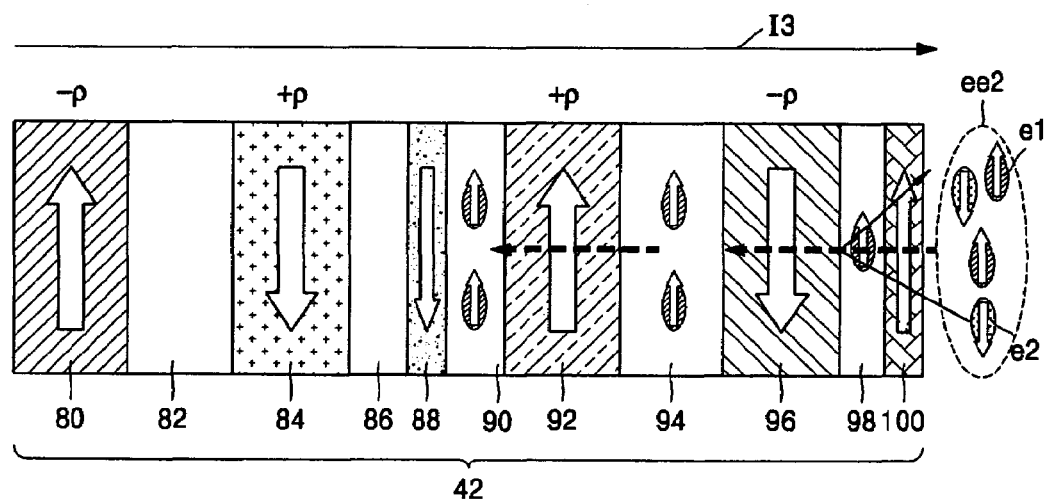
FIGS. 29 is a cross-sectional view illustrating a flow of electrons when a third current having a current density less than that of a first current flows from bottom to top of the free magnetic layer of the magnetic storage node of FIG. 24 after the first current flows from top to bottom of the free magnetic layer of the magnetic storage node, in the case where the first, second, third, and fourth magnetic layers of the magnetic storage node of FIG. 24 are ferromagnetic layers having negative, positive, positive, and negative polarization characteristics, respectively, and the magnetic polarizations thereof are up, down, up, and down, respectively.
Figure 30:
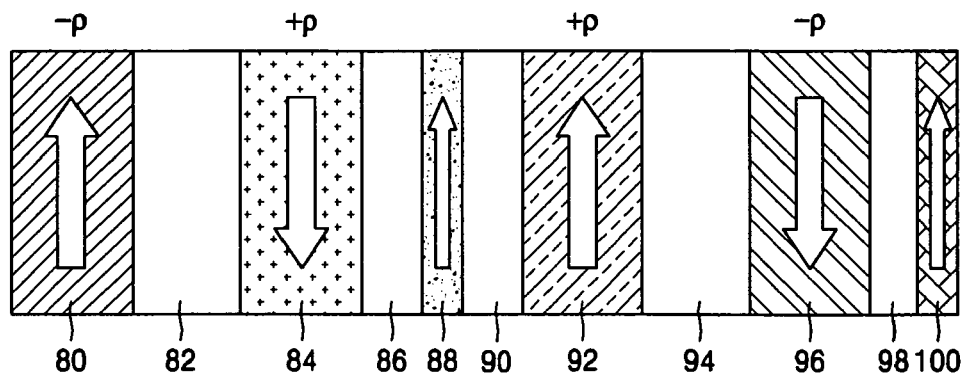
FIG. 30 is a cross-sectional view illustrating the magnetic polarizations of the free magnetic layers after the third current flows therethrough as illustrated in FIG. 29.

FIGS. 29 and 30 illustrate changes in the magnetic polarization of the first and second free magnetic layers 88 and 100 when the first current I1 having a predetermined current density (see FIG. 25) is supplied to allow electrons to flow from the first magnetic layer 80 through the first free magnetic layer 88 to the second free magnetic layer 100, and then a third current I3 having a lower current density than the first current I1 is supplied to allow electrons to flow in the opposite direction to the first current I1. The difference in the thicknesses of arrows indicating the first and third currents I1 and I3 in FIGS. 25 and 29 indicates the difference in the current density.

Specifically, when the first current I1 is supplied to the magnetic storage node 42 of FIG. 24, the flow of the electrons e is as illustrated in FIG. 25. Accordingly, the magnetic polarizations of the first and second free magnetic layers 88 and 100 after supplying the first current I1 are as illustrated in FIG. 26. FIG. 29 illustrates the process of supplying the third current I3 to the magnetic storage node 42 in which the magnetic polarizations of the first and second free magnetic layers 88 and 100 are as illustrated in FIG. 26. FIG. 30 illustrates the final magnetic polarizations of the first and second free magnetic layers 88 and 100 after the third current I3 is supplied. Accordingly, the magnetic polarizations of the first and second free magnetic layers 88 and 100 in FIG. 29 are those obtained after the first current I1 is supplied.

Referring to FIG. 29, electrons ee2 flow in the opposite direction to the third current I3 (illustrated by a solid arrow). The broken arrow indicates the direction in which the electrons ee2 flow. When the electrons ee2 are incident on the fourth magnetic layer 96 after passing through the second free magnetic layer 100, the electrons ee2 are reflected at the boundary between the fourth magnetic layer 96 and the fifth non-magnetic layer 98 to the second free magnetic layer 100. Although the spin-down electrons e2 are reflected, the number of the reflected spin-down electrons e2 is small, and thus the magnetic polarization of the second free magnetic layer 100 is not reversed but is maintained in the direction determined by the first current I1. Meanwhile, when the electrons ee2 sequentially pass through the fourth magnetic layer 96 and the third magnetic layer 92, only the spin-up electrons e1 enter the first free magnetic layer 88, which is magnetically polarized downward due to the first current I1. Since the number of the spin-up electrons e1 entering the first free magnetic layer 88 is greater than the number of the spin-down electrons e2 reflected to the second free magnetic layer 100, the number of the spin-up electrons e1 can be at least a threshold value for reversing the magnetic polarization of the first free magnetic layer 88. Accordingly, the magnetic polarization of the first free magnetic layer 88 becomes upward, and is the same as the magnetic polarization of the second free magnetic layer 100, as illustrated in FIG. 30.

Figure 31:
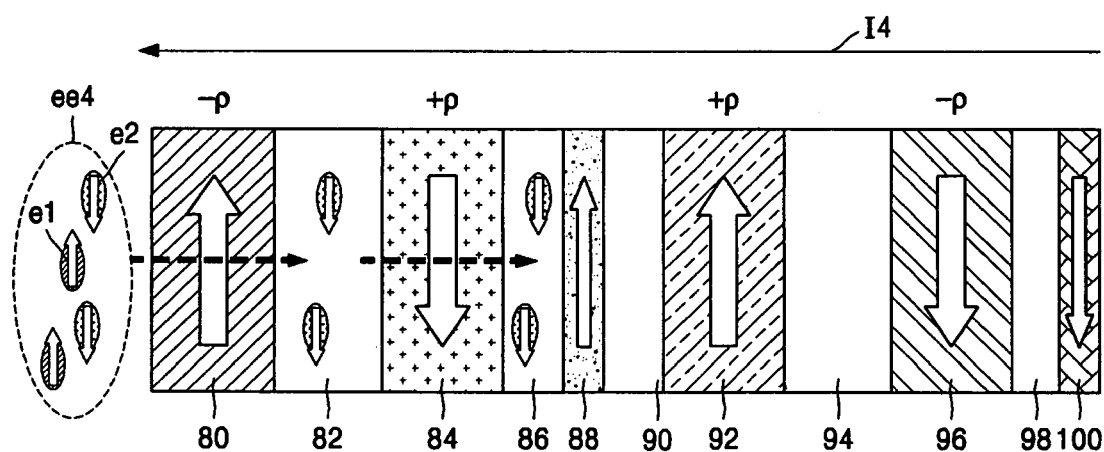
FIGS. 31 is a cross-sectional view illustrating a flow of electrons when a fourth current having, a current density less than that of a second current flows from top to bottom of the free magnetic layer of the magnetic storage node of FIG. 24, in the case where the first, second, third, and fourth magnetic layers of the magnetic storage node of FIG. 24 are ferromagnetic layers having negative, positive, positive, and negative polarization characteristics, respectively, the magnetic polarizations thereof are up, down, up, and down, respectively, and the magnetic polarizations of first and second free magnetic layers are up and down, respectively, after a second current is applied.
Figure 32:
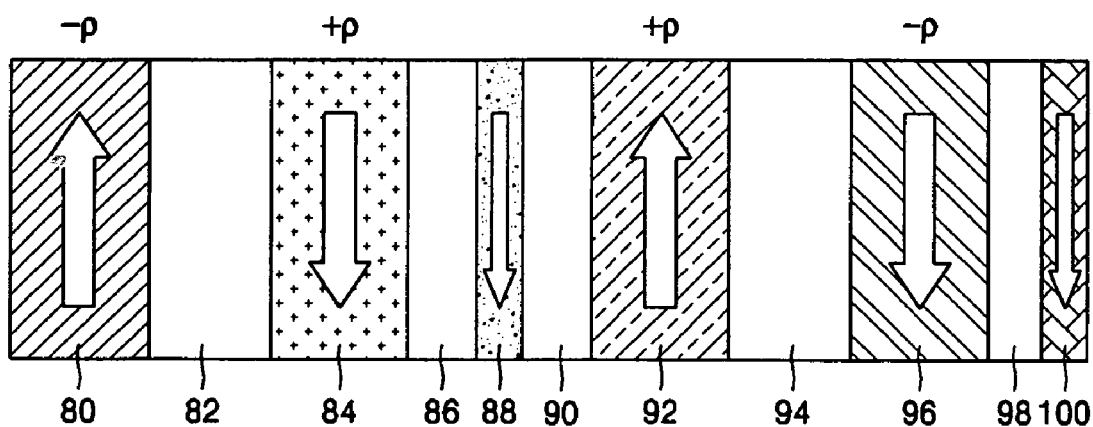
FIG. 32 is a cross-sectional view illustrating the magnetic polarizations of the free magnetic layers after the fourth current flows therethrough as illustrated in FIG. 31.

FIGS. 31 and 32 illustrate changes in the magnetic polarizations of the first and second free magnetic layers 88 and 100 when the second current I2 having a predetermined current density (see FIG. 25) is supplied in order to allow electrons to flow from the second free magnetic layer 100 to the first free magnetic layer 88, and then a fourth current I4 having a lower current density than the second current I2 is supplied in order to allow electrons to flow in the opposite direction to the second current I2. The difference in the thicknesses of arrows indicating the second and fourth currents I2 and I4 in FIGS. 27 and 31 indicates the difference in the current density. When the second current I2 is supplied to the magnetic storage node 42 of FIG. 24, the flow of the electrons e is the same as illustrated in FIG. 27. Accordingly, the magnetic polarizations of the first and second free magnetic layers 88 and 100 after supplying the second current I2 are as illustrated in FIG. 27. FIG. 31 illustrates the process of supplying the fourth current I4 to the magnetic storage node 42 in which the magnetic polarizations of the first and second free magnetic layers 88 and 100 are as illustrated in FIG. 27. FIG. 32 illustrates the final magnetic polarizations of the first and second free magnetic layers 88 and 100 after the fourth current I4 is supplied. Accordingly, the magnetic polarizations of the first and second free magnetic layers 88 and 100 in FIG. 31 are those obtained after the second current I2 is supplied.

Referring to FIG. 31, electrons ee4 flow in the opposite direction to the fourth current I4 (illustrated by a solid arrow). The broken arrow indicates the direction in which the electrons ee4 flows. When the electrons ee4 are incident on the first magnetic layer 80 having negative polarization characteristic and a downward magnetic polarization, the spin-up electrons e1 among the electrons ee4 cannot pass the first magnetic layer 80 because the spin-up electrons e1 are polarized in the same direction as the first magnetic layer 80. Since the current density of the fourth current I4 is much lower than that of the second current I2, almost none of the spin-up electrons e1 can pass through the first magnetic layer 80. Accordingly, the electrons ee4 passing through the first magnetic layer 80 may include only the spin-down electrons e2. Since the second magnetic layer 84 has the positive polarization characteristic and the upward magnetic polarization, the spin-down electrons e2 of having the same polarization as the second magnetic layer 84 can pass through the second magnetic layer 84. Next, the spin-down electrons e2 which pass through the second magnetic layer 84 pass through the first free magnetic layer 88. Since the spin-down electrons e2 almost all pass through the first and second magnetic layer 80 and 84, the density of the spin-down electrons e2 is sufficient to reverse the magnetic polarization of the first free magnetic layer 88. Therefore, when the spin-down electrons e2 pass through the first free magnetic layer 88, the magnetic polarization of the first free magnetic layer 88 reverses in the same direction as the spin-polarization of the spin-down electrons e2. Consequently, the magnetic polarization of the first free magnetic layer 88 becomes the same as the magnetic polarization of the second free magnetic layer 100, as illustrated in FIG. 32. The spin-down electrons e2 which pass through the first free magnetic layer 88 are blocked by the third and fourth magnetic layers 92 and 96. Accordingly, the spin-down electrons e2 which pass through the first free magnetic layer 88 cannot reach the second free magnetic layer 100, and thus the second free magnetic layer 100 is not influenced when the fourth current I4 is supplied.

In FIGS. 25 through 32, the positions of the first and second magnetic layers 80 and 84 can be exchanged. In addition, the positions of the third and fourth magnetic layers 92 and 96 can be exchanged. However, in this case, the magnetic polarizations of the third and fourth magnetic layers 92 and 96 are also changed from up and down to down and up, respectively.

From the results illustrated in FIGS. 25 through 32, when the magnetic storage node 42 includes the first and second free magnetic layers 88 and 100 as illustrated in FIG. 24, the magnetic storage node 42 has four different states according to the magnetic polarizations of the first and second free magnetic layers 88 and 100: a first state, in which the magnetic polarizations of the first and second free magnetic layers 88 and 100 are respectively down and up, as illustrated in FIG. 26; a second state, in which the magnetic polarizations of the first and second free magnetic layers 88 and 100 are respectively up and down, as illustrated in FIG. 28; a third state, in which the both magnetic polarizations of the first and second free magnetic layers 88 and 100 are both up, as illustrated in FIG. 30; and a fourth state, in which the both magnetic polarizations of the first and second free magnetic layers 88 and 100 are both down, as illustrated in FIG. 32. The first, second, third and fourth states correspond to 2-bit data, for example, 00, 01, 10, and 11, respectively. Therefore, when the magnetic storage node 42 has the structure of FIG. 24, the multi-bit magnetic memory device can be used as a multi-bit magnetic memory device.

Data recorded in the above-described multi-bit magnetic memory device is read by measuring the resistance of the magnetic storage node and comparing the measured resistance with a reference value. If the data stored in the magnetic storage node is damaged when reading the data, for example, if the magnetic polarization of one of the free magnetic layers is reversed, the reversed magnetic polarization of the free magnetic layer can be reversed again to the original direction by supplying a current having the same magnitude but opposite direction to the predetermined current supplied for measuring the resistance. Accordingly, the multi-bit magnetic memory device can maintain its non-volatile property after reading data. The reading current should be kept low enough to ensure that it is not affecting the stored data bits. Further, the current should be below the writing current threshold.

A method of manufacturing the multi-bit magnetic memory device according to an exemplary embodiment of the present invention will now be described.

Figure 33:
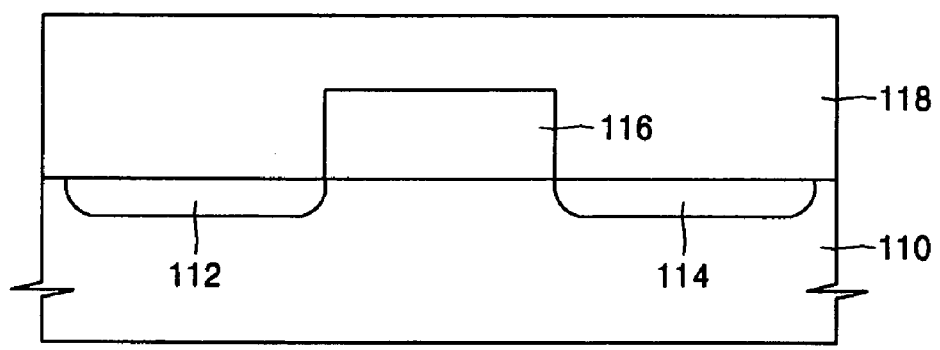
FIGS. 33 through 39 are cross-sectional views illustrating a method of manufacturing a magnetic memory device according to an exemplary embodiment of the present invention.

Referring to FIG. 33, a field oxide layer (not illustrated) is formed on a predetermined region of a substrate 110. A gate is formed on a predetermined region of the substrate 110 where the field oxide layer is not formed. The substrate 110 may be a p-type semiconductor substrate. The gate 116 may include a gate insulation layer, a gate electrode, and a gate spacer. First and second impurity regions 112 and 114 are formed in the substrate 110 between the field oxide layer and the gate 116. The first and second impurity regions 112 and 114 may be formed by ion-implantation of predetermined conductive impurities, for example, n-typed impurities. The first and second impurity regions 112 and 114 are symmetrically formed with respect to the gate 116. If the first impurity region 112 is a drain region, the second impurity region 112 may or may not be a source region. The gate 116 and the first and second impurity regions 112 and 114 constitute a transistor.

A first interlayer insulation layer 118 is formed on the substrate 110 on which the transistor is formed, and the surface of the first interlayer insulation layer 118 is planarized.

Figure 34:
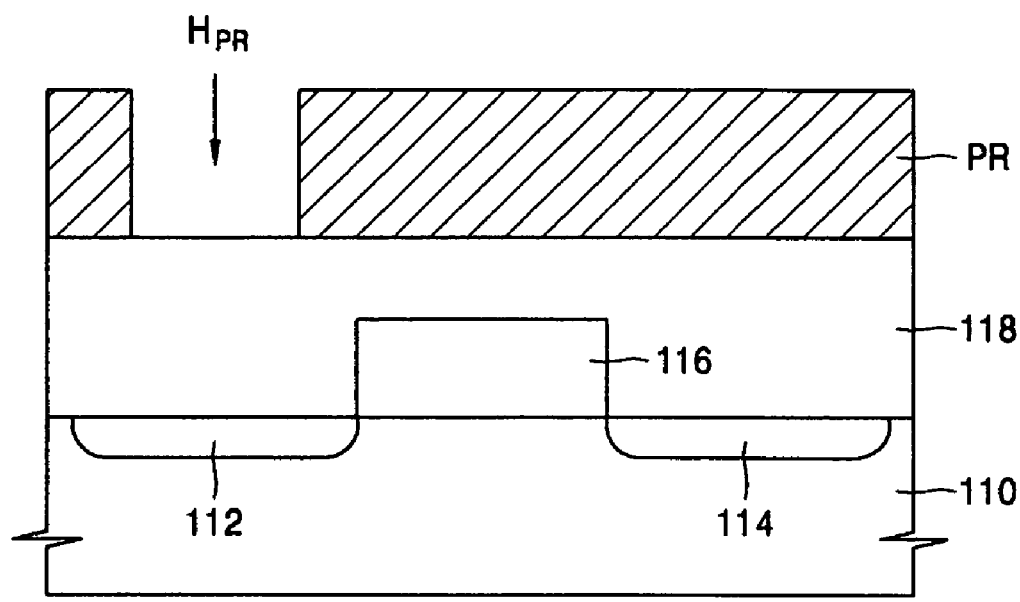
Figure 35:
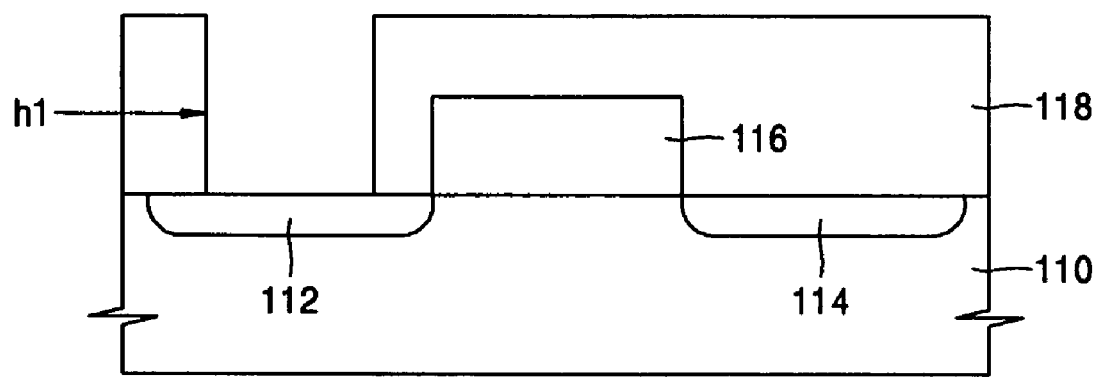

Referring to FIG. 34, an exposing layer PR is formed on the first interlayer insulation layer 118. A hole $H_{pr}$ is formed in the exposing layer PR to expose a predetermined region of the first interlayer insulation layer 118 using a photolithography process. The hole $H_{pr}$ is formed directly above the first impurity region 112. Alternatively, the hole $H_{pr}$ may be formed directly above the second impurity region 114. The exposed region of the first interlayer insulation layer 118 is etched using the exposing layer PR as a mask until the first impurity region 112 is exposed. Due to the etching, a contact hole h1 is formed in the first interlayer insulation layer 118 to expose the first impurity region 112, as illustrated in FIG. 35. Then, the exposing layer PR is removed.

Figure 36:
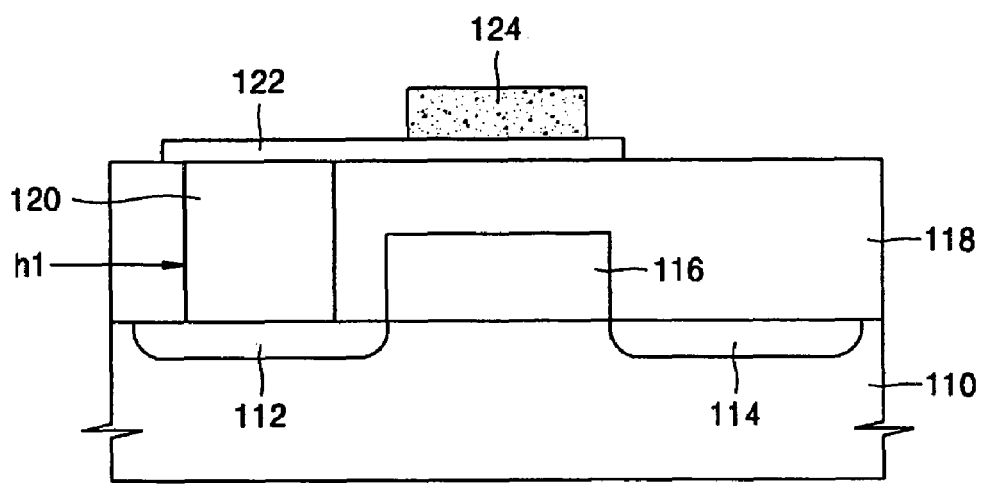
Figure 37:
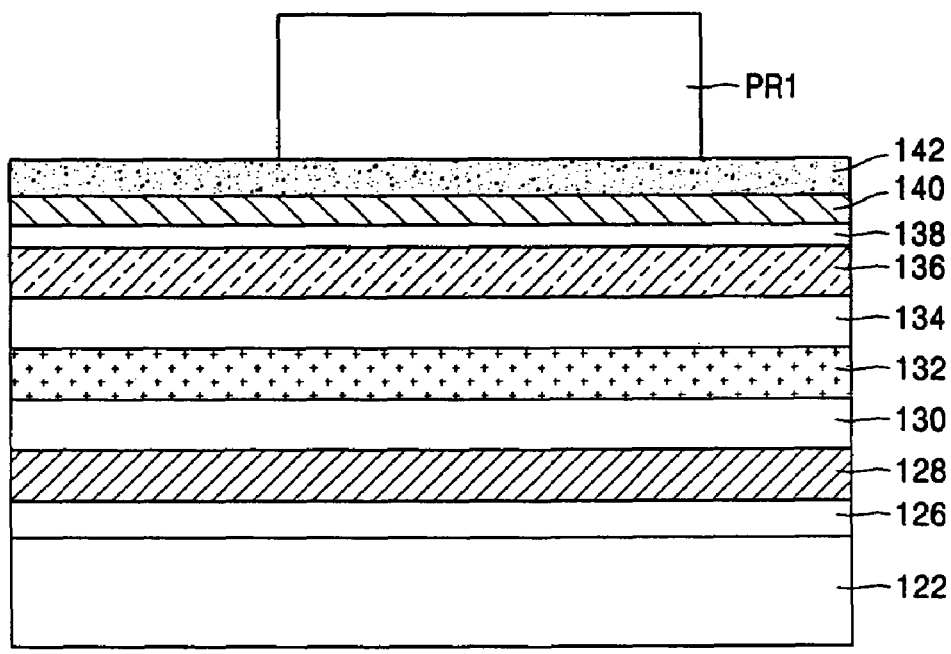
Figure 38:
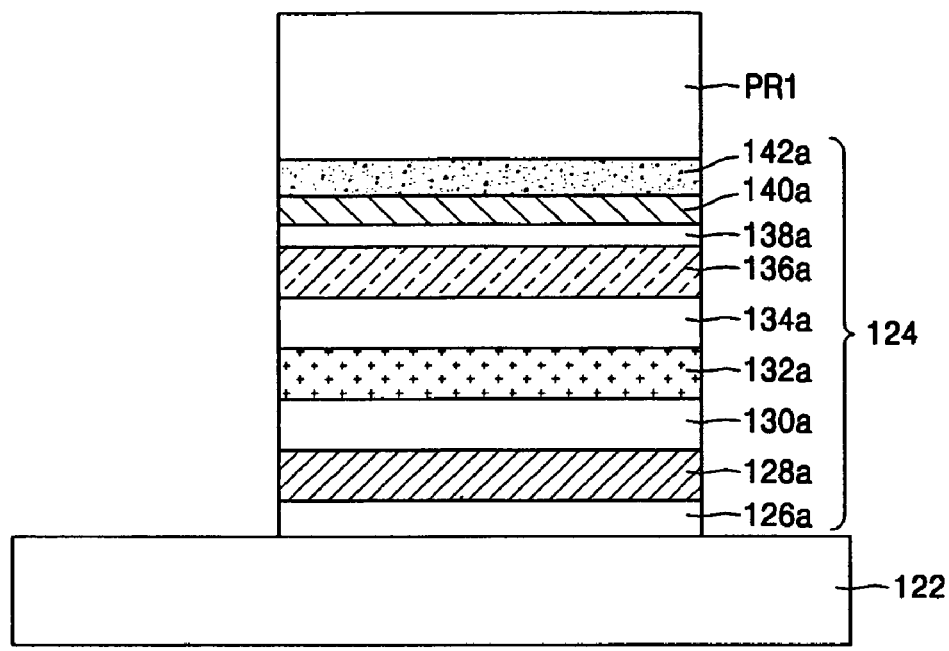

Next, referring to FIG. 36, the contact hole h1 is filled with a conductive plug 120. A conductive pad layer 122 covering the top face of the conductive plug 120 is formed on the first interlayer insulation layer 118. A magnetic storage node 124, for example, an MTJ cell, is formed on the conductive pad layer 122. The magnetic storage node 124 may be formed above the gate, as illustrated in FIG. 36, and may be formed in direct contact with the conductive plug 120 without the conductive pad layer 122. The magnetic storage node 124 may be the magnetic storage node 42 illustrated in FIG. 6, 15, or 24. FIGS. 37 and 38 illustrate the process of forming the magnetic storage node 124 when the magnetic storage node 124 has the same structure as the magnetic storage node 42 of FIG. 15.

Figure 39:
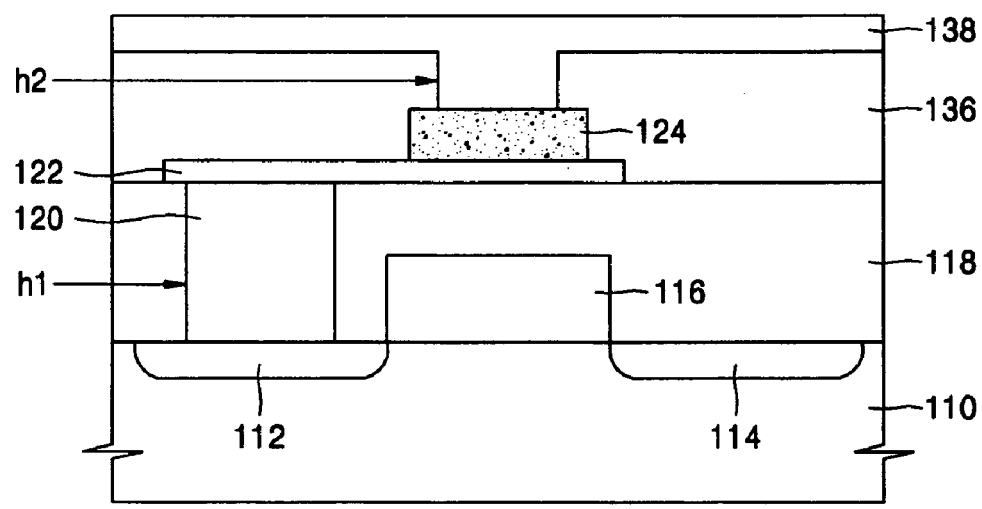

Referring to FIG. 37, a seed layer 126, a first magnetic layer 128, a first non-magnetic layer 130, a second magnetic layer 132, a second non-magnetic layer 134, a third magnetic layer 136, a third non-magnetic layer 138, a free magnetic layer 140, and a capping layer 142 are sequentially stacked on the conductive pad layer 122. The first magnetic layer 128 may be a ferromagnetic layer having positive or negative polarization characteristic. Here, the ferromagnetic layer having the positive polarization characteristic is, for example, one of a NiFe layer, a Co layer, a CoFe layer, a Ni layer, an Fe layer, and a NiFeCu layer; and the ferromagnetic layer having the negative polarization characteristic is, for example, one of FeCr layer, a $CrO_2$/Co layer, an $Fe_3O_4$ layer, a $La_{0.7}Sr_{0.3}MnO_3$ layer, and an FeCr/Cr layer. The second magnetic layer 132 may also be a ferromagnetic layer having a positive polarization characteristic or a negative polarization characteristic. However, when the first magnetic layer 128 is the positive polarization characteristic, the second magnetic layer 132 may be a negative polarization characteristic. Here, the magnetic polarization of the second magnetic layer 132 may be opposite to a magnetic polarization of the first magnetic layer 128. The third magnetic layer 136 has the same magnetic polarization characteristic as the first magnetic layer 128. The free magnetic layer is a ferromagnetic layer whose magnetic polarization can be reversed by a spin-polarized current greater than a predetermined threshold value. The third non-magnetic layer 138 is used as a tunneling layer. After stacking the material layers on the conductive pad layer 122, an exposing layer pattern PR1 covering a predetermined region of the capping layer 142 is formed on the capping layer 142. Next, exposed regions of the capping layer 142 and the portions of the material layers therebetween are etched using the exposing layer pattern PR1 as an etching mask until the conductive pad layer 122 is exposed. The magnetic storage node 124, having a seed layer pattern 126a, a first magnetic layer pattern 28a, a first non-magnetic layer pattern 130a, a second magnetic layer pattern 132a, a second non-magnetic layer pattern 134a, a third magnetic layer pattern 136a, a third non-magnetic layer pattern 138a, a free magnetic layer pattern 140a, and a capping layer pattern 142a, is formed on the conductive pad layer 122 as a result of the etching, as illustrated in FIG. 38. Then, the exposing layer pattern PR1 is removed. Referring to FIG. 39, after forming the magnetic storage node 124 is formed, a conductive pad layer 122 and a second interlayer insulation layer 136 covering the magnetic storage node 124 is formed on the first interlayer insulation layer 118. Using photographic and exposing processes, a viahole h2 is formed in the second interlayer insulation layer 136, through which an upper surface of the magnetic storage node 124, i.e., the upper surface of the capping layer pattern 142a, is exposed. Next, a bit line 138 filling the viahole h2 is formed on the second interlayer insulation layer 136.

For example, an exemplary embodiment of a magnetic memory device according to the present invention, in which a digit line is formed in the first interlayer insulation layer 118 between the gate 116 and the magnetic storage node 124, may be used as a subsidiary unit for recording bit data.

As described above, magnetic layers having positive polarization characteristic and magnetic layers having negative polarization characteristic are sequentially stacked in the magnetic storage node of a magnetic memory device according to the present invention. Therefore, the present invention can provide a memory device having a magnetically stable structure. Such a structure allows the increase of a spin-polarized current density, thereby reducing a current density required for a switching operation and making a writing operation faster.

In addition, as illustrated in FIG. 24, the magnetic storage node can include two free magnetic layers, in which multi-bit data can be recorded, and thus the integration of a device and recording density can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A magnetic memory device comprising:
   a switching device; and
   a magnetic storage node connected to the switching device, wherein the magnetic storage node includes a first magnetic layer, a second magnetic layer and a free magnetic layer, the layers being vertically and separately disposed from one another, and
   wherein the first and second magnetic layers have transmission characteristics opposite to each other for spin-polarized electrons, and have magnetic polarizations that are opposite to each other.

2. The device of claim 1, wherein the free magnetic layer comprises first and second free magnetic layers that are separately disposed from each other.

3. The device of claim 2, wherein the magnetic storage node further comprises third and fourth magnetic layers that are separately disposed between the first and second free magnetic layers, wherein the third and fourth magnetic layers have transmission characteristics opposite to each other for spin-polarized electrons, and have magnetic polarizations that are opposite to each other.

4. The device of claim 3, wherein the second and third magnetic layers are ferromagnetic layers that have the same transmission characteristics for spin-polarized electrons and have magnetic polarizations that are opposite to each other.

5. The device of claim 3, wherein the second and third magnetic layers are ferromagnetic layers that have transmission characteristics opposite to each other for spin-polarized electrons and have the same magnetic polarizations.

6. The device of claim 3, wherein the first, second, third, and fourth magnetic layers are respectively ferromagnetic layers having negative, positive, positive, and negative transmission characteristics for spin-polarized electrons, and the magnetic polarization thereof are respectively up, down, up, and down.

7. The device of claim 2, wherein the first and second free magnetic layers have different thicknesses from each other.

8. The device of claim 1, wherein the magnetic storage node further comprises a third magnetic layer that is disposed between the free magnetic layer and the second magnetic layer, and transmits electrons with an opposite spin-polarization to the electron transmitted by the second magnetic layer, and has a magnetic polarization opposite to the magnetic polarization of the second magnetic layer.

9. The device of claim 8, wherein the first, second, and third magnetic layers are respectively ferromagnetic layers having positive, negative, and positive transmission characteristics, and the magnetic polarizations thereof are up, down, and up, respectively.

10. The device of claim 8, wherein the first, second, and third magnetic layers are respectively ferromagnetic layers having negative, positive, and negative transmission characteristics, and the magnetic polarizations thereof are up, down, and up, respectively.

11. The device of claim 1, wherein the first and second magnetic layers are respectively ferromagnetic layers having negative and positive transmission characteristics, and the magnetic polarizations thereof are respectively, up and down, or down and up.

12. The device of claim 1, wherein the first and second magnetic layers are respectively ferromagnetic layers having positive and negative transmission characteristics, and the magnetic polarizations thereof are respectively up and down, or down and up.

13. The device of claim 1, wherein one of the first and second magnetic layers is a layer selected from the group consisting of a NiFe layer, a Co layer, a CoFe layer, a Ni layer, an Fe layer, and a NiFeCu layer and the other is a layer selected from the group consisting of an FeCr layer, a $CrO_2$/Co layer, an $Fe_3O_4$ layer, a $La_{0.7}Sr_{0.3}MnO_3$ layer, and an FeCr/Cr layer.

14. The device of claim 3, wherein one of the first and second magnetic layers is a layer selected from the group consisting of a NiFe layer, a Co layer, a CoFe layer, a Ni layer, an Fe layer, and a NiFeCu layer and the other is a layer selected from the group consisting of an FeCr layer, a $CrO_2$/Co layer, an $Fe_3O_4$ layer, a $La_{0.7}Sr_{0.3}MnO_3$ layer, and an FeCr/Cr layer.

15. The device of claim 1, wherein the switching device comprises a metal-oxide semiconductor field effect transistor (MOSFET), and wherein a drain of the MOSFET is connected to the first magnetic layer through a conductive pad layer.

16. The device of claim 1, wherein one of the first and second magnetic layers has a positive transmission characteristic which permits more electrons having a same magnetic polarization as one of the first and second magnetic layers to pass through the one of the first and second magnetic layers, and the other one of the first and second magnetic layers has a negative transmission characteristic which permits more electrons having an opposite magnetic polarization as the other one of the first and second magnetic layers to pass through the other one of the first and second magnetic layers.

17. A method of operating a magnetic memory device including a switching device and a magnetic storage node connected to the switching device, wherein the magnetic storage node includes a first magnetic layer, a second magnetic layer and a free magnetic layer which are vertically and separately disposed from one another, and the first and second magnetic layers transmit electrons with opposite spins and have the magnetic polarizations that are opposite to each other, the method comprising:
supplying a first current having spin up and spin down electrons to the magnetic storage node.

18. The method of claim 17, wherein the first current is supplied from the free magnetic layer to the first magnetic layer or in an opposite direction.

19. The method of claim 17, wherein a third magnetic layer is further disposed between the free magnetic layer and the second magnetic layer, and the transmission characteristic and the magnetic polarization of the third magnetic layer for the electrons are opposite to those of the second magnetic layer.

20. The method of claim 17, wherein the free magnetic layer further comprises first and second free magnetic layers separated each other.

21. The method of claim 20, wherein third and fourth magnetic layers are separately disposed between the first and second magnetic layers, wherein the third and fourth magnetic layers respectively have transmission characteristics opposite to each other for the electrons, and have the magnetic polarizations that are opposite to each other.

22. The method of claim 21, wherein the second and third magnetic layers are ferromagnetic layers that respectively have the same transmission characteristics for the electrons and have magnetic polarizations that are opposite to each other.

23. The method of claim 21, wherein the second and third magnetic layers are ferromagnetic layers that respectively have transmission characteristics opposite to each other for the electrons and have the same magnetic polarizations.

24. The method of claim 21, wherein the first, second, third, and fourth magnetic layers are respectively ferromagnetic layers having negative, positive, positive, and negative transmission characteristics for the electrons, and the magnetic polarization thereof are respectively up, down, up, and down.

25. The method of claim 21, wherein the first and second free magnetic layers have different thicknesses from each other.

26. The method of claim 19, wherein the first, second, and third magnetic layers are respectively ferromagnetic layers having negative, positive, and negative transmission characteristics for the electrons, and the magnetic polarizations thereof are respectively up, down, and up.

27. The method of claim 19, wherein the first, second, and third magnetic layers are respectively ferromagnetic layers having positive, negative, and positive transmission characteristics for the electrons, and the magnetic polarizations thereof are respectively up, down, and up.

28. The method of claim 21, wherein a second current having a lower current density than the first current is supplied in the opposite direction to the first current after the first current is supplied.

29. The method of claim 17, wherein the switching device comprises a metal-oxide semiconductor field effect transistor (MOSFET), and
wherein a drain of the MOSFET is connected to the first magnetic layer through a conductive pad layer.

30. The method of claim 17, wherein the first and second magnetic layers have transmission characteristics opposite to each other for spin-polarized electrons, and have the magnetic polarizations that are opposite to each other, and
wherein one of the first and second magnetic layers has a positive transmission characteristic which permits more electrons having a same magnetic polarization as one of the first and second magnetic layers to pass through the one of the first and second magnetic layers, and the other one of the first and second magnetic layers has a negative transmission characteristic which permits more electrons having an opposite magnetic polarization as the other one of the first and second magnetic layers to pass through the other one of the first and second magnetic layers.

* * * * *